United States Patent [19]

Vor et al.

[11] Patent Number: 5,045,916
[45] Date of Patent: Sep. 3, 1991

[54] EXTENDED SILICIDE AND EXTERNAL CONTACT TECHNOLOGY

[75] Inventors: Madhukar B. Vor, Los Gatos; Gregory N. Burton, Burlingame; Ashok K. Kapoor, Palo Alto, all of

[73] Assignee: Fairchild Semiconductor Corporation, Cupertino, Calif.

[21] Appl. No.: 383,245

[22] Filed: Jul. 19, 1989

Related U.S. Application Data

[63] Continuation of Ser. No. 817,231, Jan. 8, 1986, abandoned, which is a continuation-in-part of Ser. No. 693,062, Jan. 22, 1985, abandoned.

[51] Int. Cl.$^5$ .................... H01L 23/48; H01L 27/02; H01L 29/78; H01L 21/44
[52] U.S. Cl. ........................................ 357/71; 357/67; 357/43; 357/23.1; 437/188; 437/202
[58] Field of Search ................ 357/67, 59, 43, 71, 357/23.1; 437/187, 188, 196, 202

[56] References Cited

U.S. PATENT DOCUMENTS 4,080,719 3/1978 Wilting .................... 29/571
(List continued on next page.)

FOREIGN PATENT DOCUMENTS

| 0046371 | 2/1982 | European Pat. Off. . |
| 0054259 | 6/1982 | European Pat. Off. . |
| 00975595 | 1/1984 | European Pat. Off. . |
| 0104616 | 4/1984 | European Pat. Off. . |
| 2081507 | 2/1982 | United Kingdom . |
| 2134706 | 8/1984 | United Kingdom . |

OTHER PUBLICATIONS

IEDM Technical Digest, Dec. 1984, pp. 118-120 by Chem et al 357/67s.
IBM Technical Disclosure Bulletin, vol. 27 #10A Mar. 1985 pp. 5870-5875.
Tang, et al., *VLSI Local Interconnect Level Using Titanium Nitride*, IEDM Digest pp. 590-593, Dec. 1985.
Electronics International, vol 55, No. 25, 15 Dec. 1982, pp. 138-145, New York, U.S.; R. Beresford: "Special Report IEDM Device Meeting Probes the Limits of Semiconductors and Circuitry".
IBM Technical Disclosure Bulletin, vol. 21, No. 3, Aug. 1978, pp. 1250-1251, New York, U.S.; V. L. Rideout: "Fabricating Low Resistance Interconnection Lines and FET Gates in a Single Step".
IBM Technical Disclosure Bulletin, vol. 26, No. 5, Oct. 1983, pp. 2597-2599, New York, U.S.: H, Chao et al.: "High Capacitance Dynamic Random-Access Memory Cell with Self-Aligned Storage Capacitor".

*Primary Examiner*—Mark Prenty
*Attorney, Agent, or Firm*—Lee Patch; Robert C. Colwell; Vern Norviel

[57] ABSTRACT

There is disclosed a process for making high performance bipolar and high performance MOS devices on the same integrated circuit die. The process comprises forming isoaltion islands of epitaxial silicon surrounded by field oxide and forming MOS transistors having polysilicon gates in some islands and forming bipolar transistors having polysilicon emitters in other islands. Insulating spacers are then formed around the edges of the polysilicon electrodes by anisotropically etching a layer of insulation material, usually thermally grown silicon dioxide covered with additional oxide deposited by CVD. A layer of refractory metal, preferably titanium covered with tungsten, is then deposited and heat treated at a temperature high enough to form only titanium disilicide to form silicide over the tops of the polysilicon electrodes and on top of the bases, sources and drains. Regions of this refractory metal are then masked off such that the electrical contact with the silicide is preserved and so that the refractory metal extends to a contact pad position external to the isolation island. Metal posts can be formed at the contact pad positions and a layer of planarized insulation material is formed so to leave only the tops of the posts exposed. A layer of metal can then be deposited and etched to make electrical contact with tops of the posts.

12 Claims, 17 Drawing Sheets

U.S. PATENT DOCUMENTS

| | | | |
|---|---|---|---|
| 4,121,240 | 10/1978 | Katto | 357/71 P |
| 4,124,934 | 11/1978 | DeBrebisson | 29/590 |
| 4,249,968 | 2/1981 | Gardiner et al. | 148/174 |
| 4,295,264 | 10/1981 | Rogers | 357/23.6 |
| 4,484,211 | 11/1984 | Takemoto | 357/20 |
| 4,521,952 | 6/1985 | Riseman | 357/71 X |
| 4,581,623 | 4/1986 | Wang | 357/71 S |
| 4,593,454 | 6/1986 | Baudrant | 357/67 S |
| 4,609,568 | 9/1986 | Koh et al. | 427/85 |
| 4,613,565 | 9/1986 | Shimizu | 357/59 I |
| 4,621,276 | 11/1986 | Malhi | 357/71 S |
| 4,657,628 | 4/1987 | Holloway et al. | 156/643 |
| 4,676,866 | 6/1987 | Tang et al. | 156/643 |
| 4,679,300 | 7/1987 | Chan | 357/23.6 |
| 4,690,730 | 9/1987 | Tang et al. | 156/643 |
| 4,720,908 | 1/1988 | Wills | 357/71 |
| 4,746,219 | 5/1988 | Holloway et al. | 357/23.11 |
| 4,764,480 | 8/1988 | Vora | 437/54 |

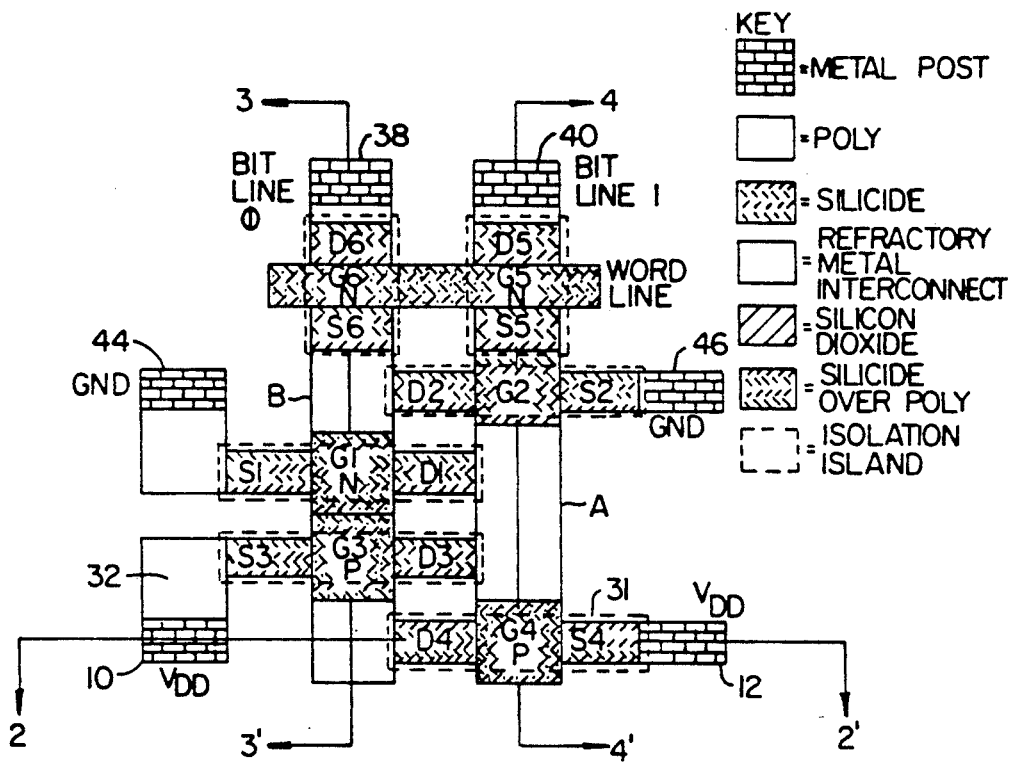
FIG._1.
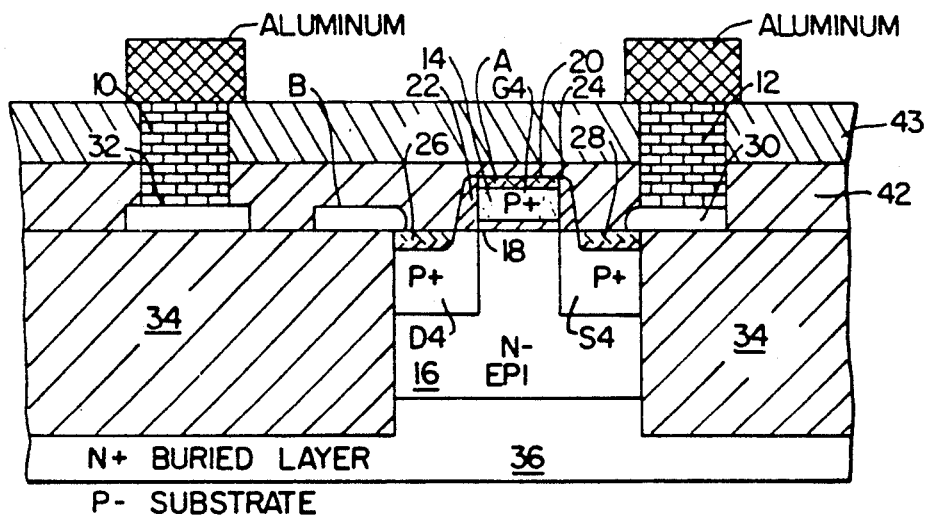
FIG._2.

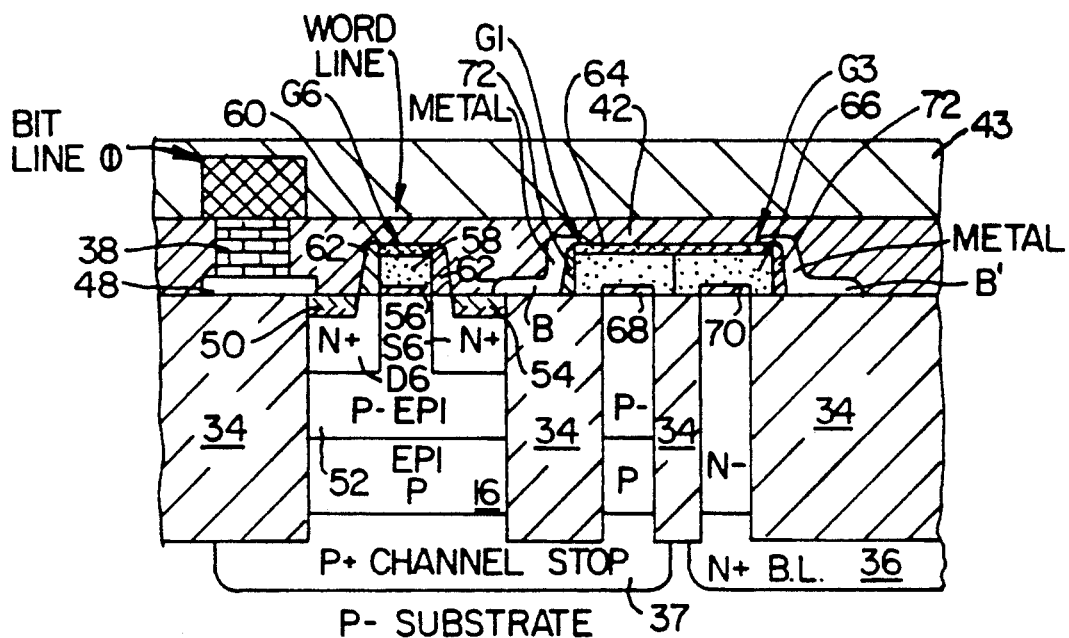
FIG._3.
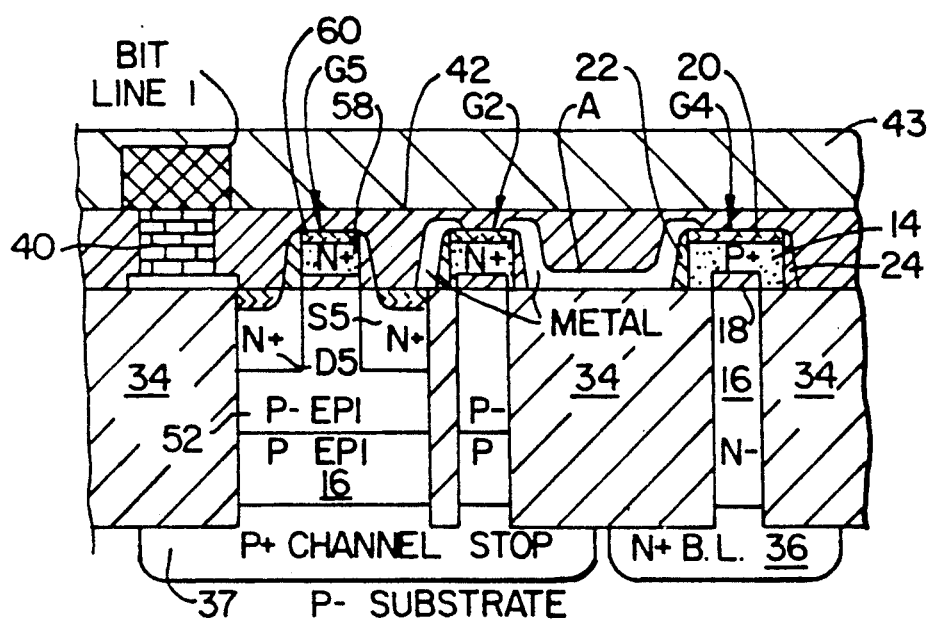
FIG._4.

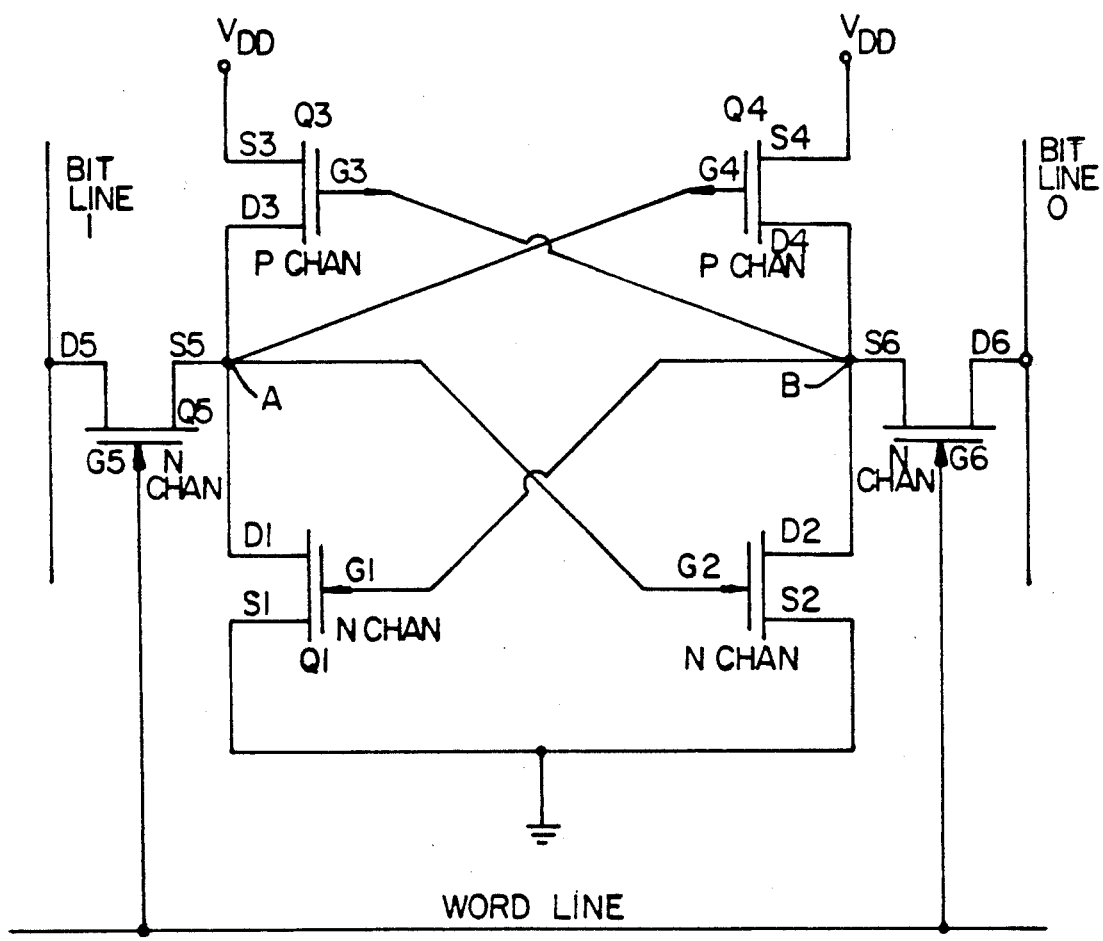
FIG._5.

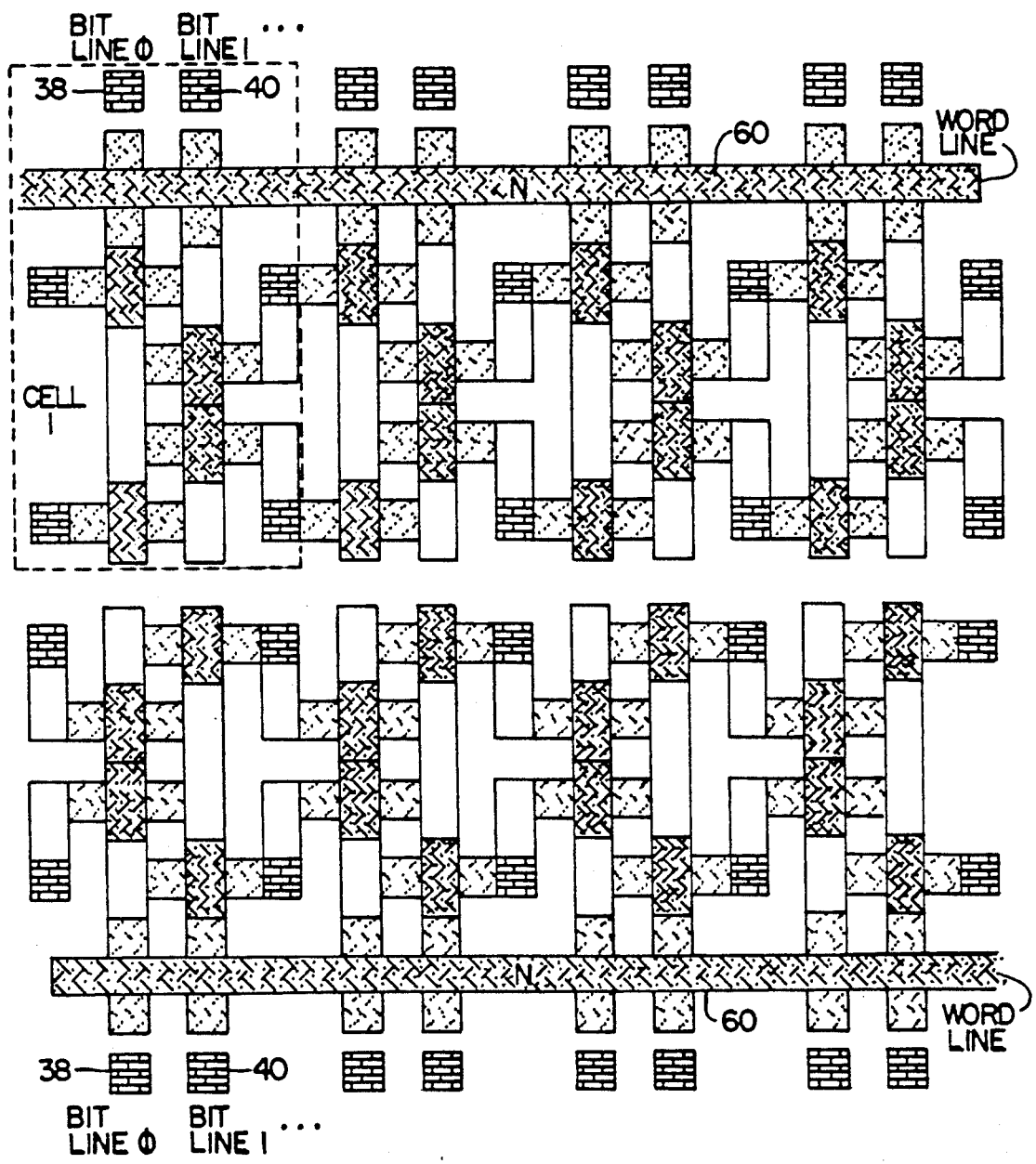
FIG._6.

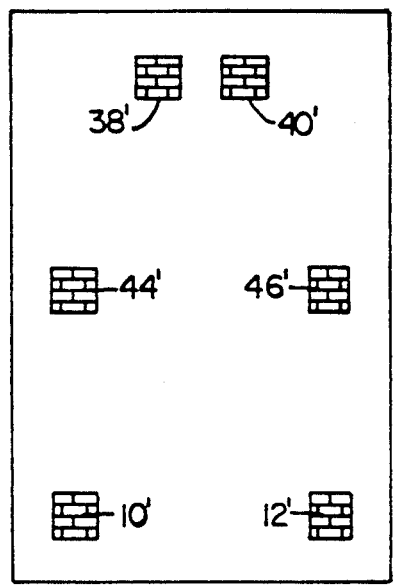
FIG._7.
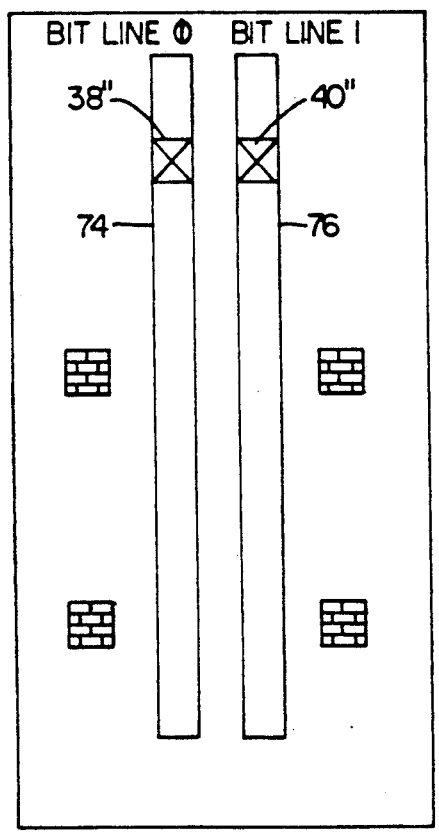
FIG._8.
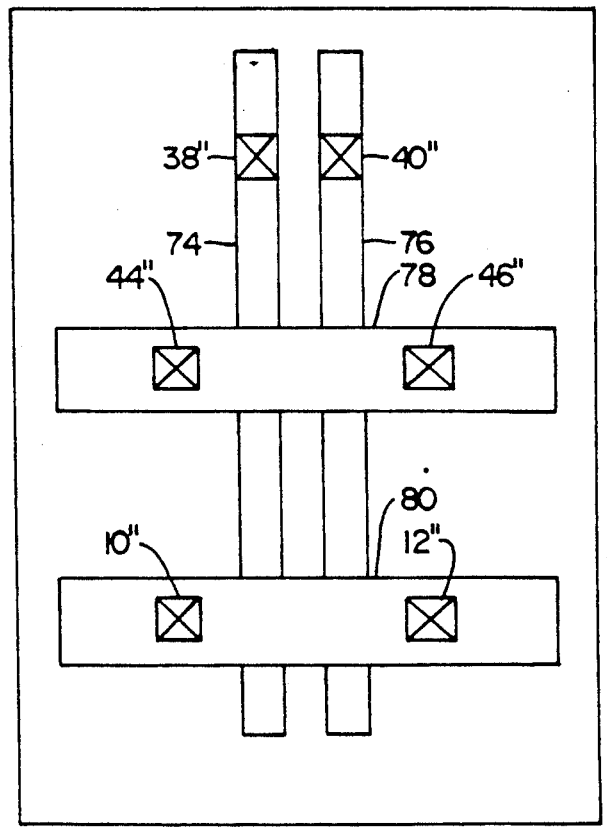
FIG._9.

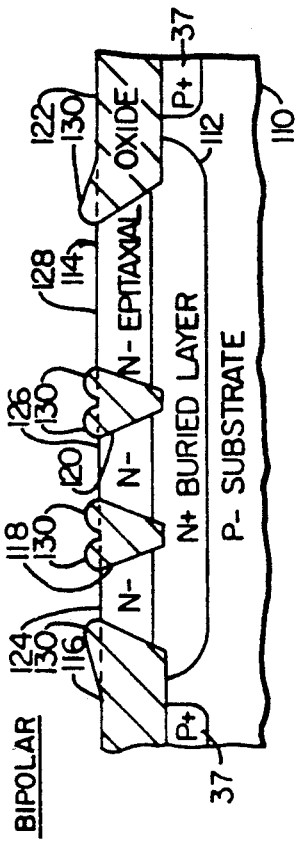
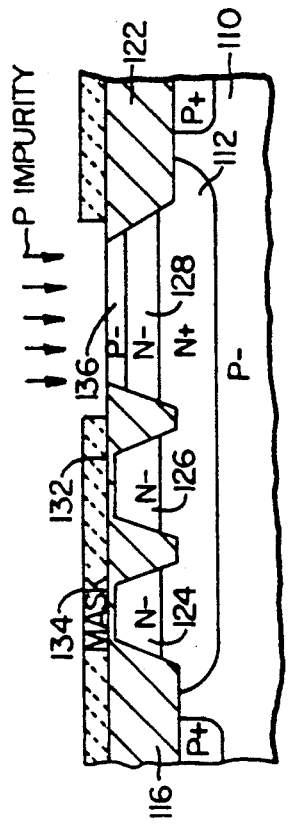
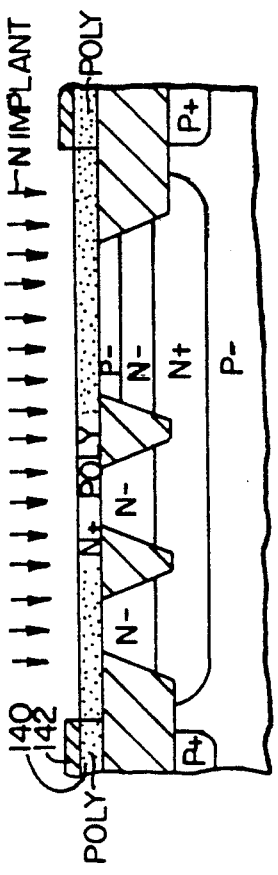
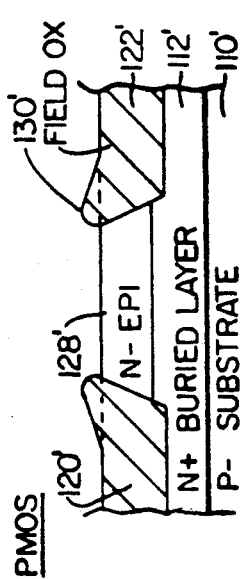
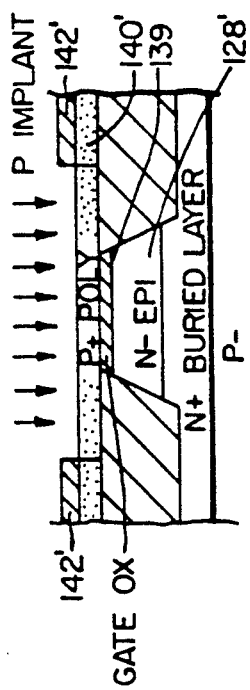

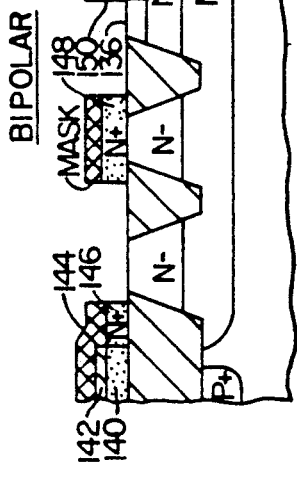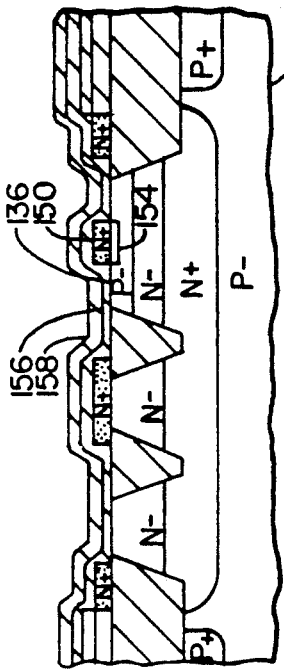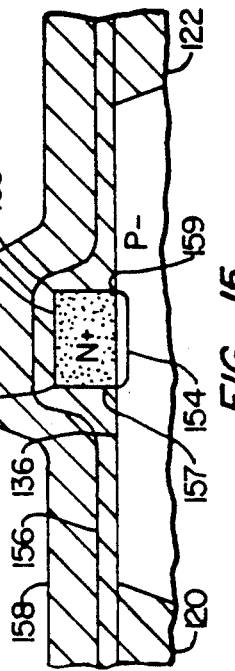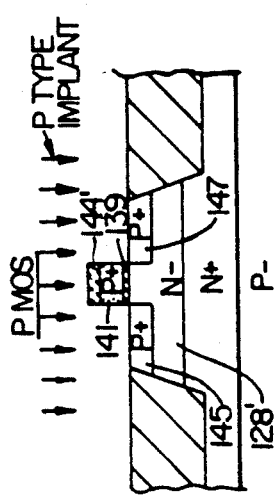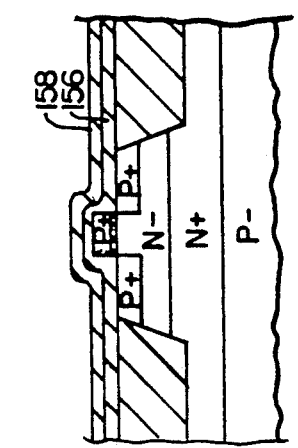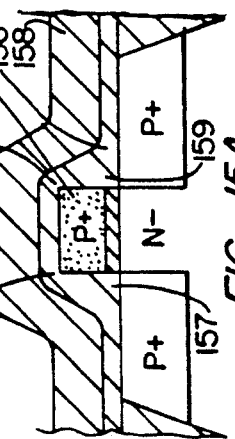

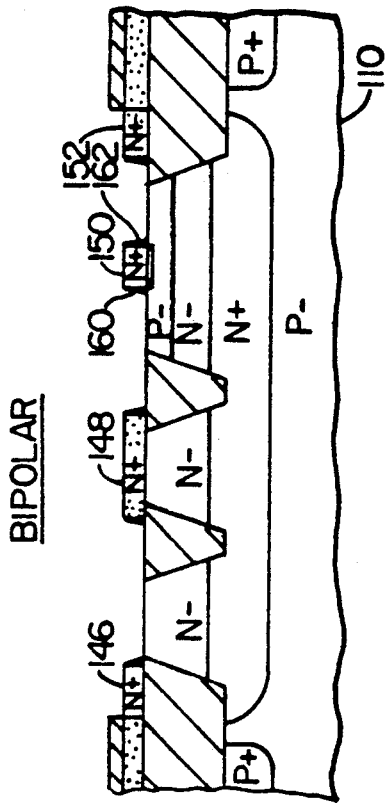
FIG._16.
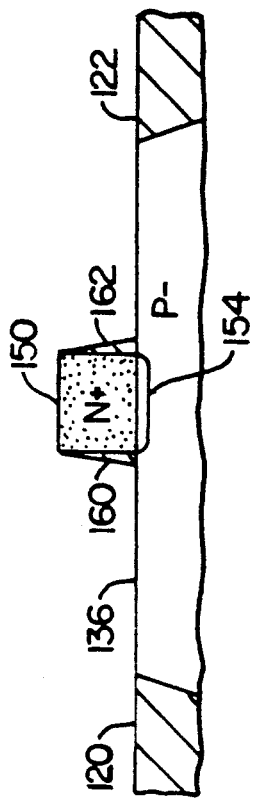
FIG._17.
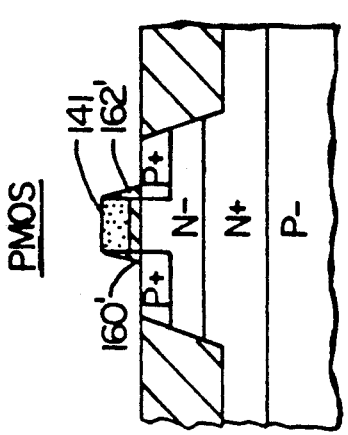
FIG._16A.
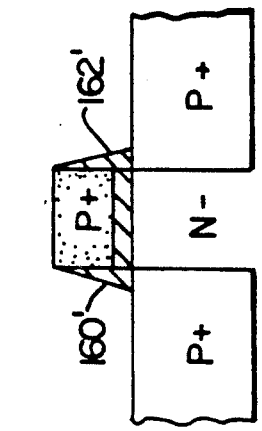
FIG._17A.

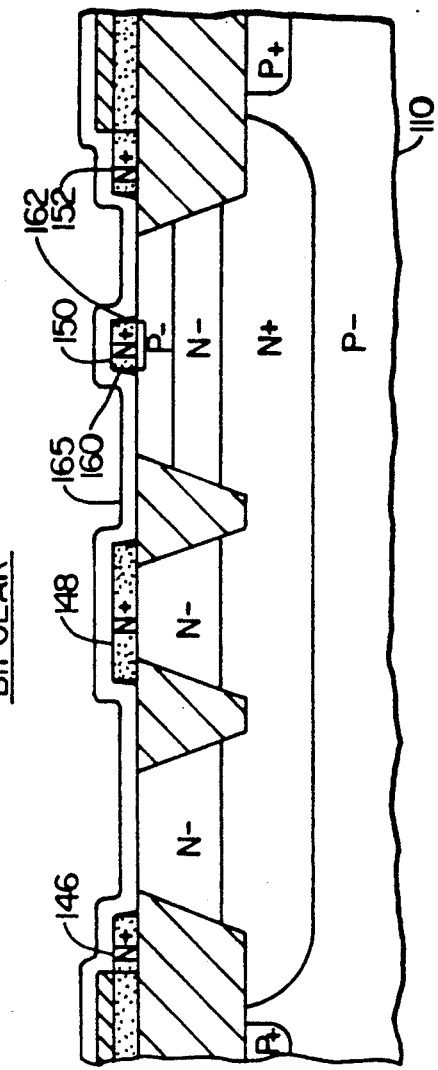
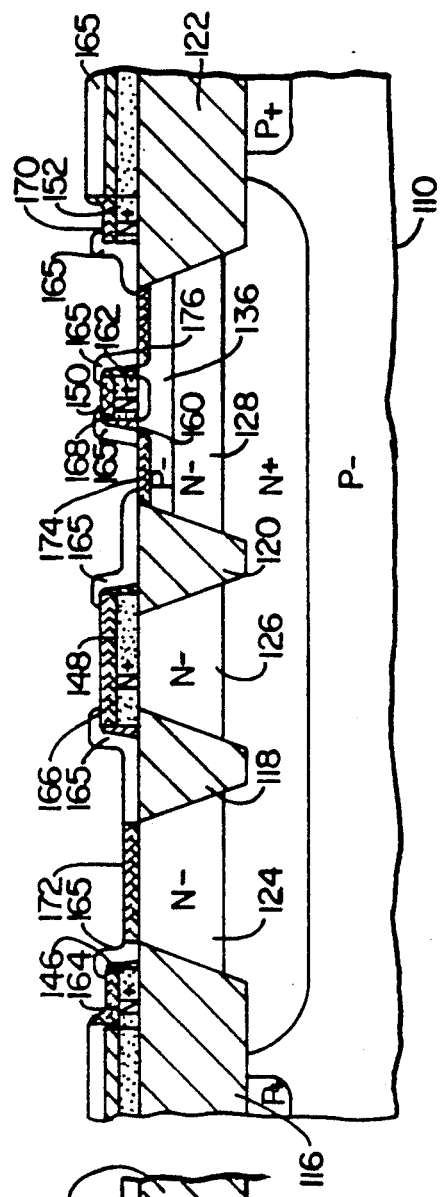
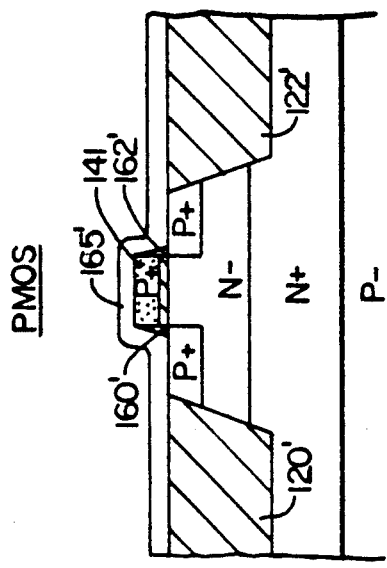
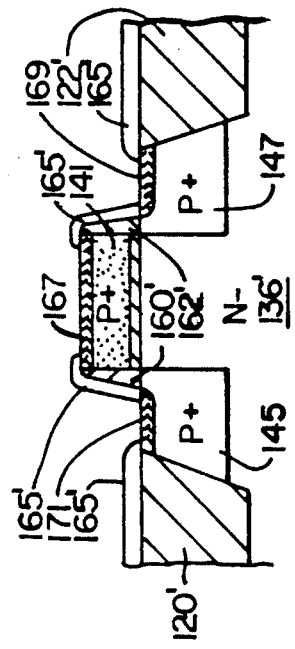
FIG.—18.
FIG.—19.
FIG.—18A.
FIG.—19A.

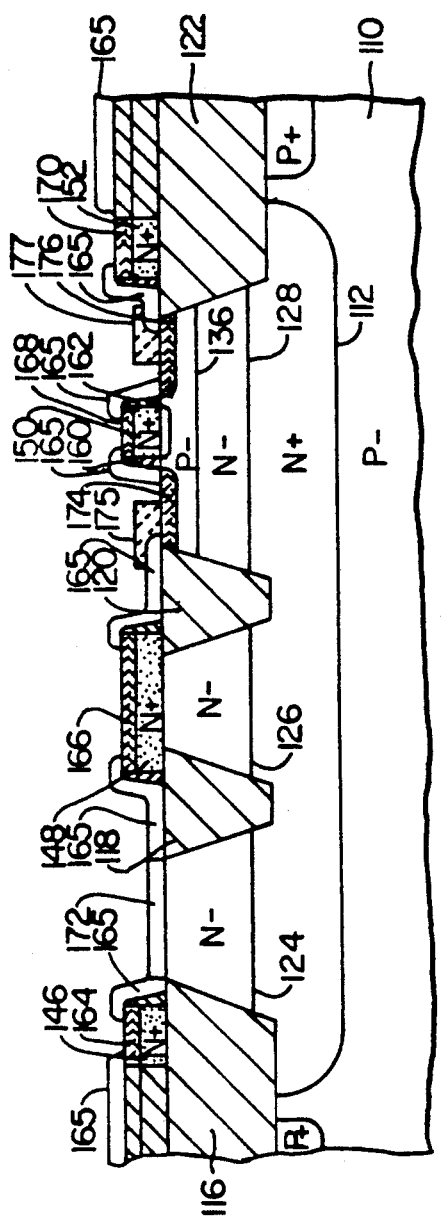
FIG._20.
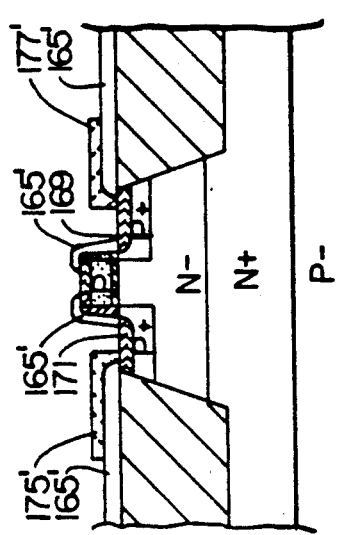
FIG._20A.
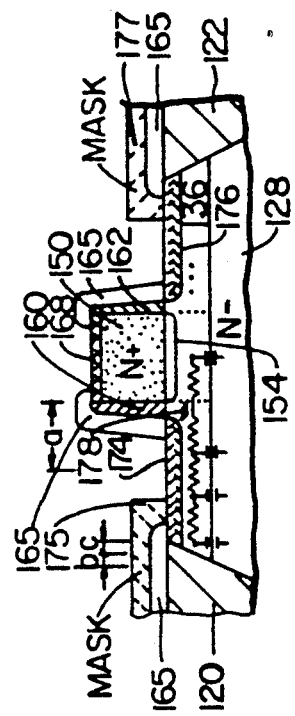
FIG._21.
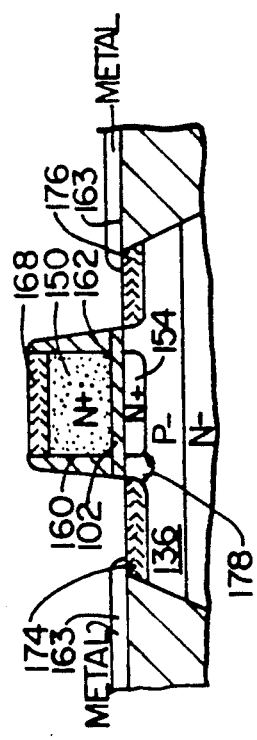
FIG._26.

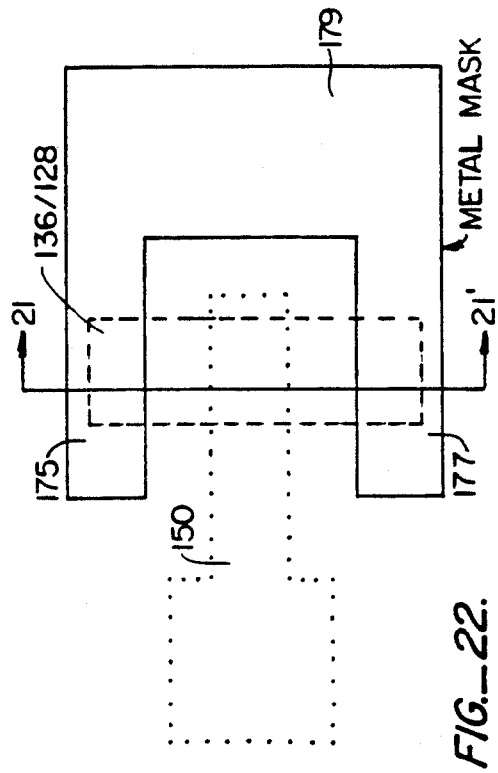
FIG._22.
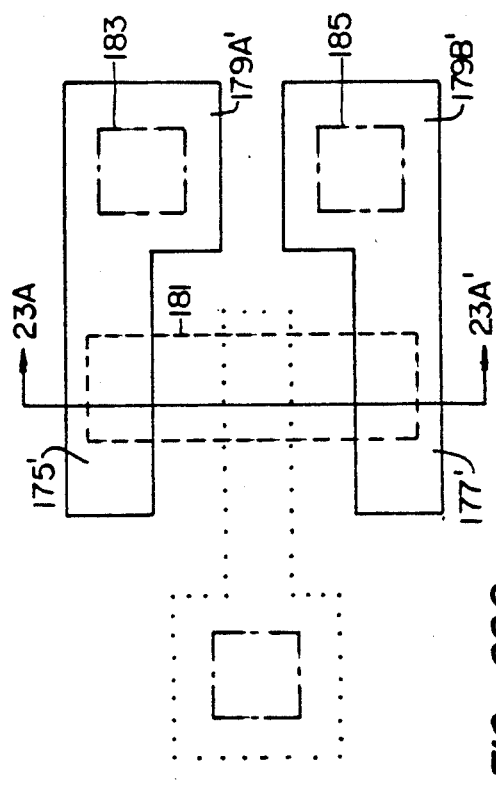
FIG._22C.
FIG._22A.
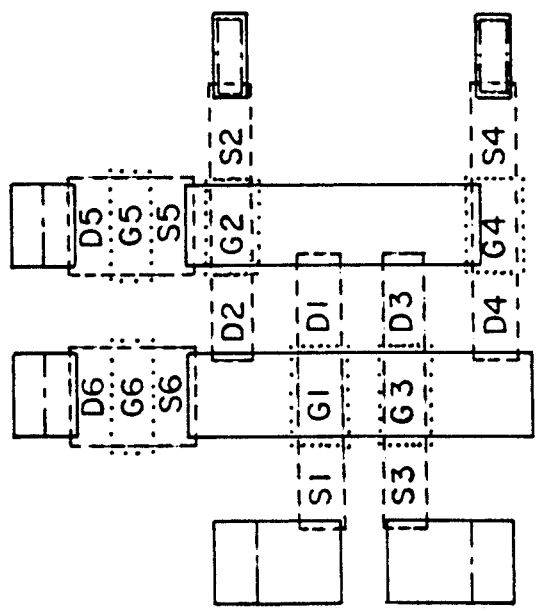
FIG._22B.

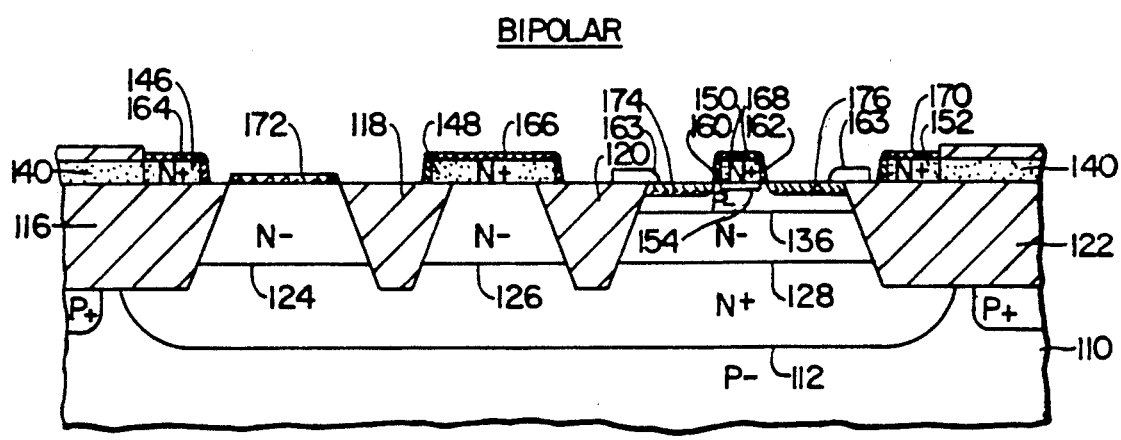
FIG._23.
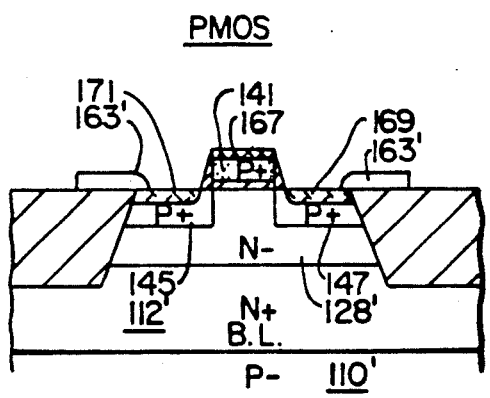
FIG._23A.

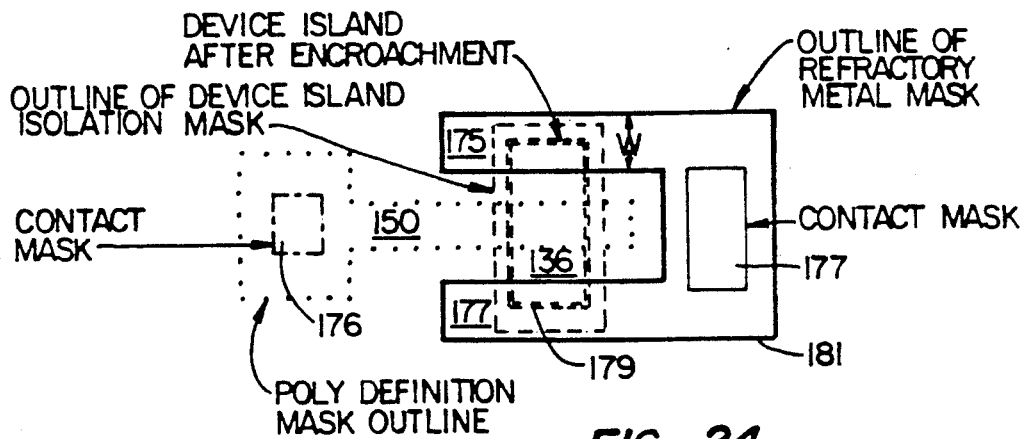
FIG._24.
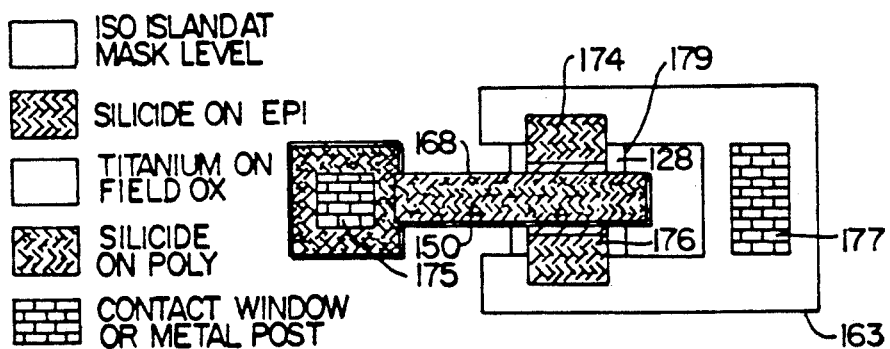
FIG._25.
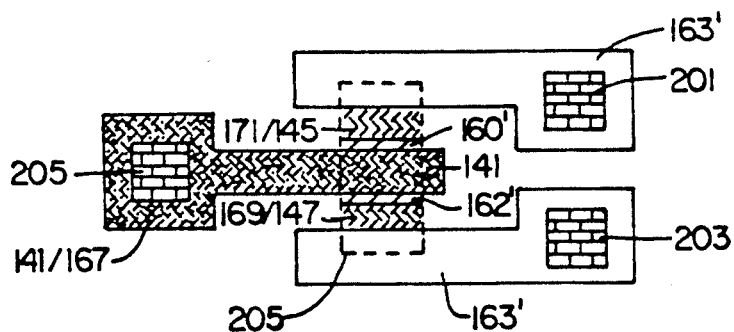
FIG._25A.

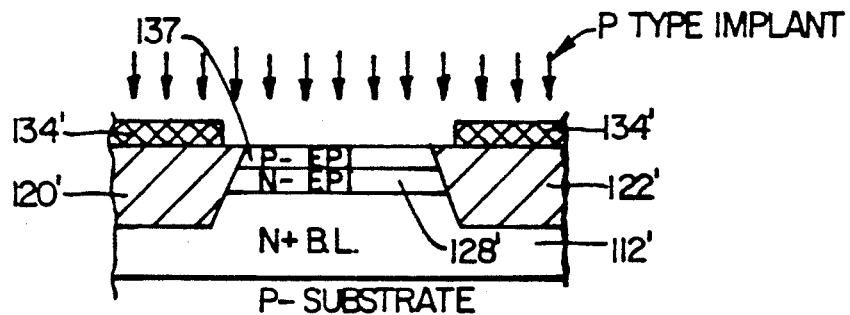
FIG._27.
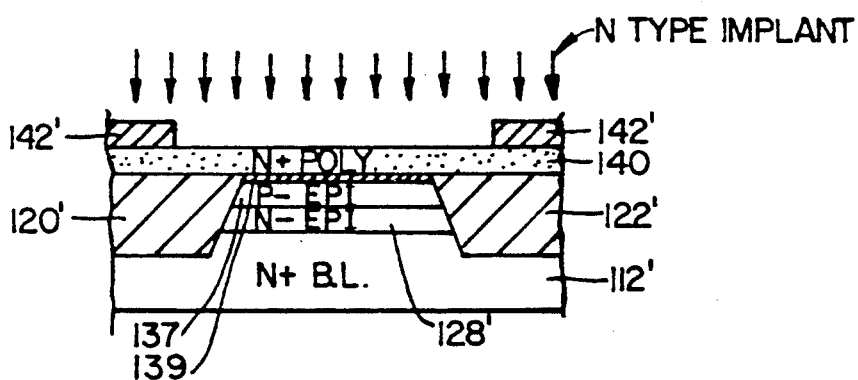
FIG._28.
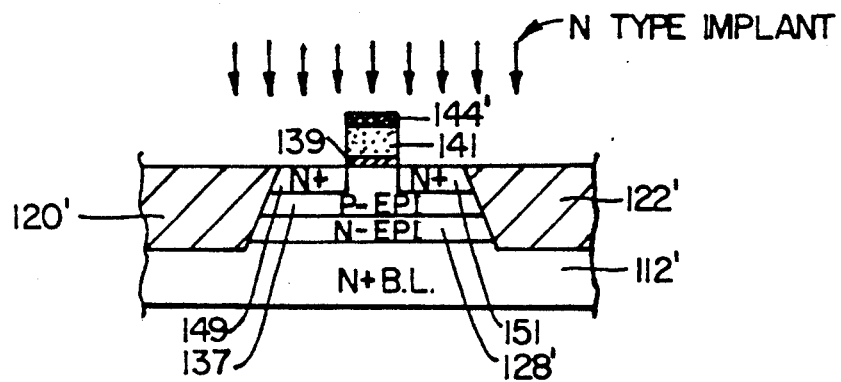
FIG._29.

CMOS & NMOS PROCESS MODIFICATIONS
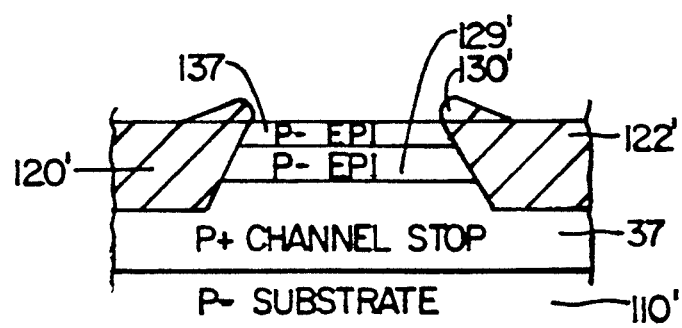
FIG._30.
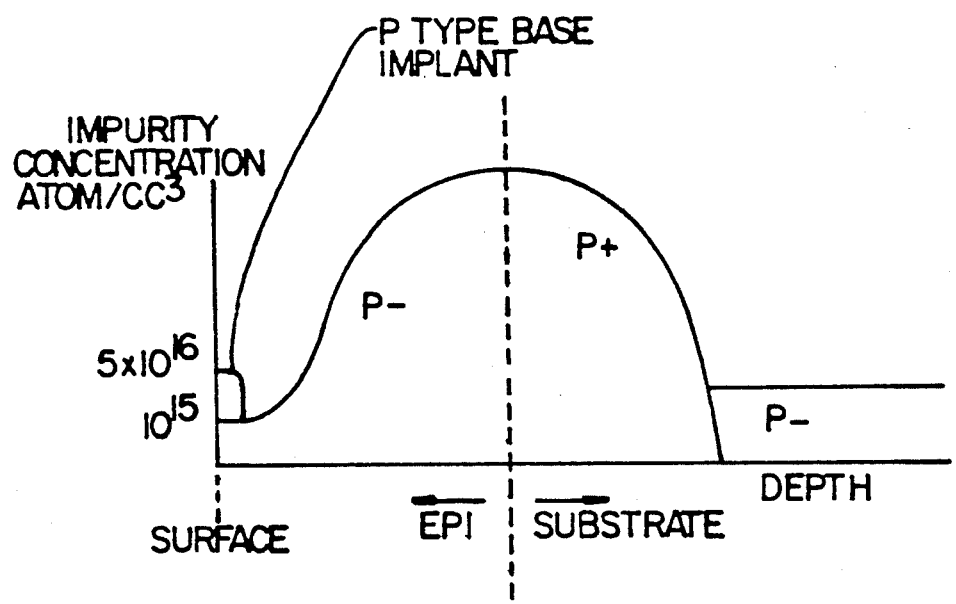
FIG._31.

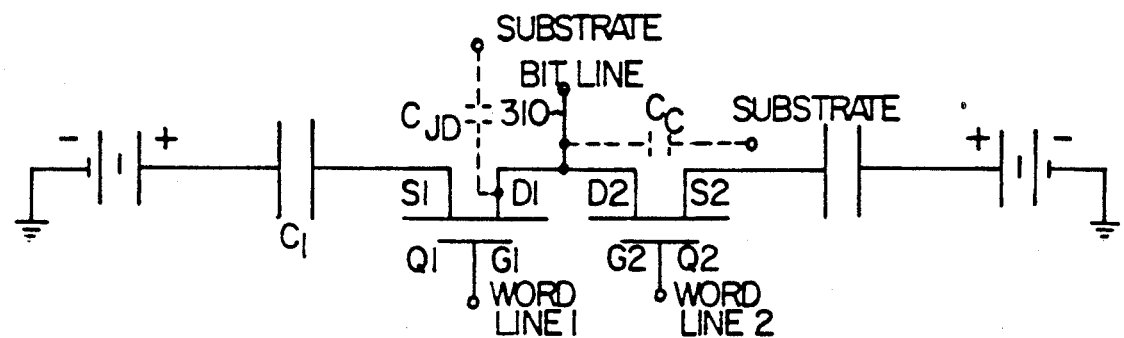
FIG._32.
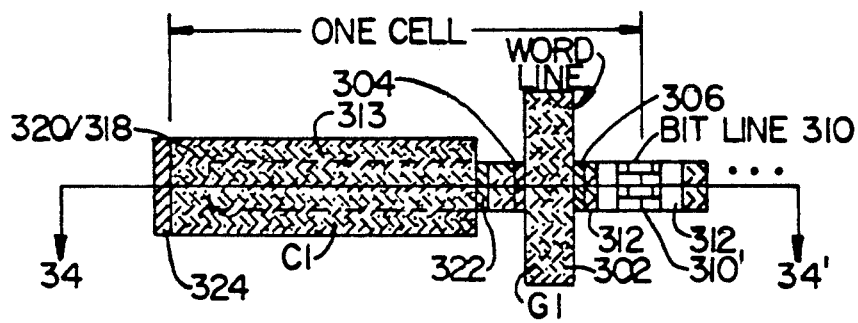
FIG._33.
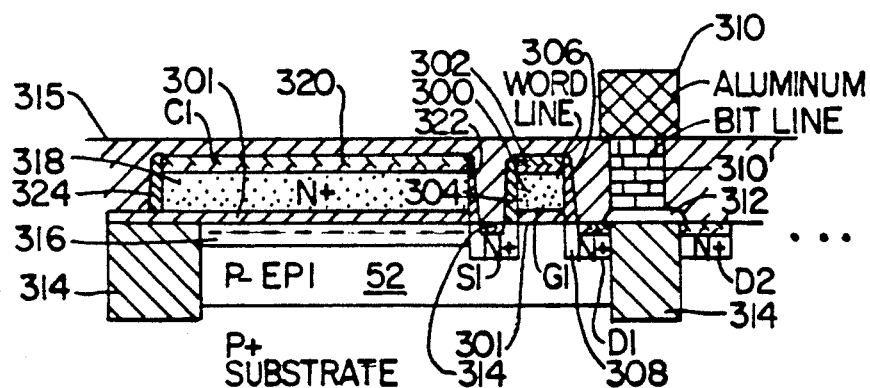
FIG._34.

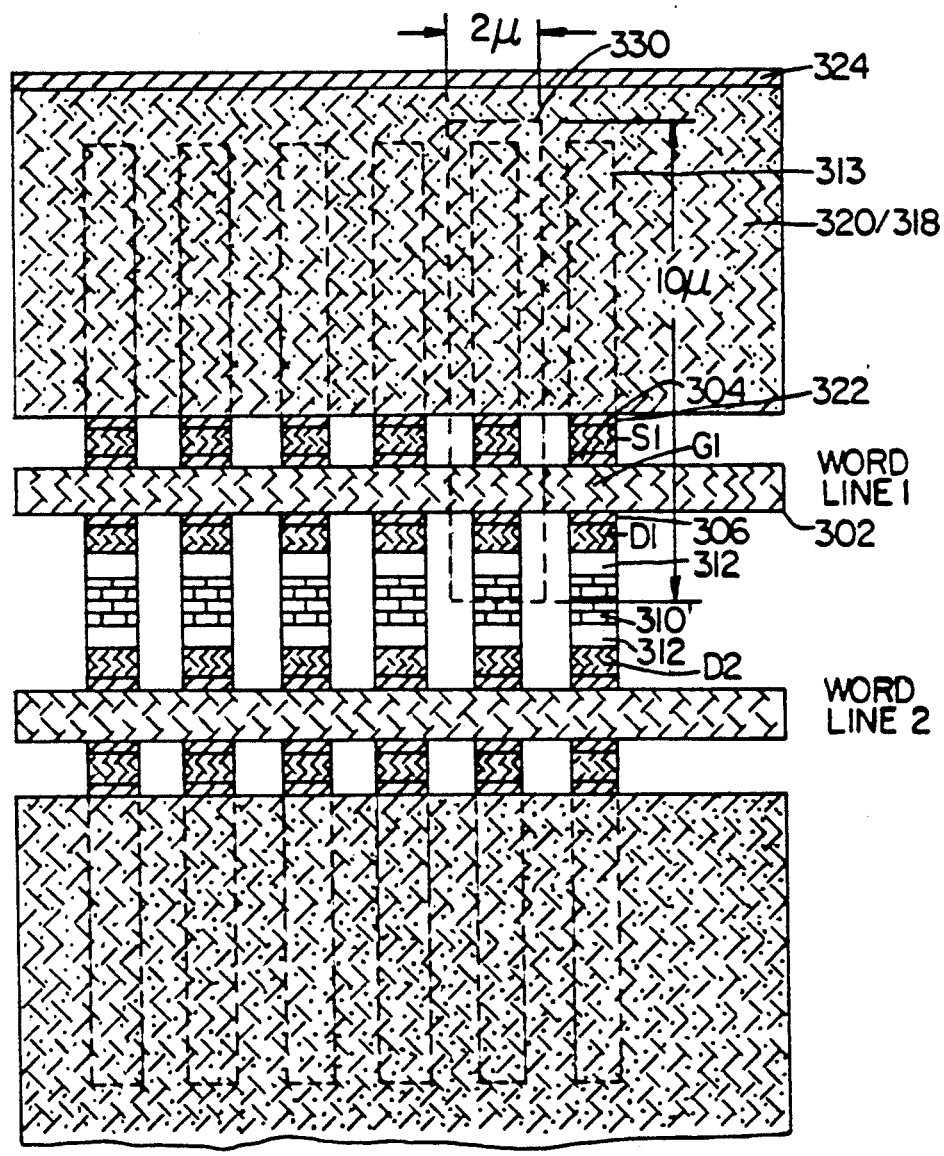
FIG._35.

EXTENDED SILICIDE AND EXTERNAL CONTACT TECHNOLOGY

This is a continuation of application Ser. No. 817,231, filed Jan. 8, 1986, now abandoned, which is a continuation-in-part of a commonly assigned U.S. patent application entitled "Self Aligned Extended Base Contact For a Bipolar Transistor Having Reduced Cell Size and Improved Electrical Characteristics", Ser. No. 693,062, filed Jan. 22, 1985 and now abandoned.

BACKGROUND OF THE INVENTION

The invention relates to the field of extended silicide and external contact technology.

As computer usage grows, the demand for memory increases proportionately with ever increasing size of programs. The expense of large numbers of memory chips to implement a good size working memory however creates a bias toward implementing ever more memory cells on a single die. This decreases the package count, increases the reliability and decreases cost. If the same number of memory cells can be fit on a smaller die, the yield for that die will increase. Further, if more memory cells can be fit on the same size die then the yield for that die should be substantially the same, but the cost per bit will be less. Consequently there has developed a trend to try mightily to decrease the size of a single memory cell in its linear dimensions and area such that denser memory arrays can be fabricated at a lower cost per bit of storage.

Another major factor in the trend toward smaller memory cells is operating speed. Operating speed depends heavily upon the amount of capacitance coupled to various nodes in the circuit. Capacitance can arise from one conductor crossing over another, and from the transition and depletion capacitances associated with PN junctions. Since capacitance is directly related to the area of the capacitor, there will be a corresponding decrease in junction capacitances associated with transistors if the size of the transistor is decreased. The result is higher operating speed.

One of the factors in determining cells size and transistor size is the presence or absence of contacts to various nodes in the circuit and to the source and drain nodes of MOS transistors and to the emitter, base and collector nodes of bipolar transistors. Contacts often involve contact windows etched down through intervening insulation areas to the node of interest. Thereafter, metal is deposited over the chip such that it is deposited into the contact window and makes contact with the node of interest.

The difficulty with this is that a contact window cannot be made smaller than the minimum photolithographically obtainable dimension. In addition, to insure that the contact window hits its target given the vagaries of the alignment process during fabrication, it is necessary to make the target larger such that it overlaps the dimensions of the contact window to account for alignment tolerances and errors of alignment by fab operators. Accordingly, a need has arisen for a smaller transistor structure and a way of making very small transistors which can be used to make smaller and faster memory cells of both the static and dynamic variety. Further, there has arisen a need to devise a cell which minimizes the number of external contacts and thereby minimizes the number of contact window inside the perimeter of the cell to minimize the area consumed by the cell.

SUMMARY OF THE INVENTION

One way of doing this is to make transistors with no need for contact holes to lie within the perimeter of the isolation island of the transistor. Such a transistor would advantageously have self aligned windowless contacts to the nodes of the transistors. Such a process would also lend itself to self aligned windowless contact to other nodes in the circuit as well.

The invention includes a static RAM cell in the CMOS technology and a dynamic RAM cell in the NMOS technology both cells being made with an improved, smaller and faster MOS transistor which can be made with a process which can produce both high performance bipolar and high performance MOS devices on the same integrated circuit. The MOS devices made using the process use isolation islands, and for the CMOS devices the isolation well are used instead of P or N wells to minimize parasitic junction capacitances caused by the presence of the wells. A feature of the invention is a single polysilicon (poly) silicide enhanced transistor structure with no contact windows inside the perimeter of the isolation island of the transistor. The transistor structure of the invention uses silicide source and drain contacts. Contact to these nodes is another feature of the invention in that contact is made through extensions of these silicide contacts using refractory metal which connects the silicide source and drain nodes to contact pads which are large enough for contact windows and which are located outside the perimeter of the transistor isolation island.

An interconnect pattern is etched in this refractory metal layer to form the conductors leading to the contact pads outside the perimeter of the cell. It is through contact windows to these pads where external contact to the cell can be made without increasing the size of the transistor. In the preferred embodiment, the refractory metal layer is a sandwich of titanium with tungsten on top, although other embodiments may use one refractory metal alone. Single height and double height posts are etched over the contact pads in a metal which is deposited over the refractory metal contact pads. This metal is selected so that it can be selectively etched by an etchant that will not attack the underlying refractory metal. These posts act as vias which pass through two overlying layer of insulation and which can be contacted by layers of metal etched into conductive patterns overlying the insulation layers to form the conductors of the circuit.

The overlying insulation layers can be formed by any planarization process which can be used to form an insulating layer over the entire cell. Both overlying insulation layers are formed in this manner one at a time. The first planarized layer can then be etched back to expose the tops of the single height posts, and a first metal layer can be deposited and etched to form a conducting pattern contacting the tops of the single height posts to make certain of the necessary connections. Then another layer of planarized insulation material can be deposited and etched back to expose the tops of the double height posts. A second layer of metal can then be deposited and etched to form a second layer of interconnects contacting the tops of the double height posts to make certain of the other necessary external connections.

The elimination of contact windows inside the isolation island of the transistors allows each transistor to be smaller and faster because it minimizes the parasitic junction capacitances associated with each transistor by virtue of reducing the sizes of its various junctions. The reduced transistor size also reduces the size of the memory cells fabricated therewith and speeds up their operation.

In the preferred embodiment, the static RAM cell has 4 NMOS transistors and 2 PMOS transistors, but the reverse situation with 4 PMOS and 2 NMOS transistors could also be used. Another feature of the invention is that extensive node sharing is used by utilizing the same refractory metal layer which was used to form the silicide as an extra interconnect layer. This decreases the area of the overall cell. That is, the overall area of the static RAM cell is further minimized by minimization of the number of contact windows within the perimeter of the RAM cell. This is achieved by combining nodes which only need to contact other nodes in the cell and which need not be contacted by conductors outside the cell itself. These nodes are combined at the refractory metal level thereby eliminating the need for contact windows to these nodes and the formation of a conductor to another contact window over another node in the same cell. Using two micron design rules, the cell size for the static RAM cell is approximately 300 square microns.

BRIEF DESCRIPTION OF THE DRAWINGS

FIG. 1 is a plan view of the layout of the CMOS static RAM cell of the invention.

FIG. 2 is a cross sectional view of the cell taken along the section line 2—2' in FIG. 1.

FIG. 3 is a cross sectional view of the cell taken along the section line 3—3' in FIG. 1.

FIG. 4 is a cross sectional view of the cell taken along the section line 4—4' in FIG. 1.

FIG. 5 is the circuit implemented by the cell layout of FIGS. 1-4.

FIG. 6 is a plan view of a typical layout for a 4 column by 2 row memory array using the static RAM cell of the invention.

FIG. 7 is a plan view of the post mask to define the posts for the external contacts to a single for the static RAM cell of FIG. 1.

FIG. 8 is a plan view of the first metal mask overlying the post mask to define the metal bit line conductors.

FIG. 9 is a plan view of the second metal mask overlying the post mask and the first metal mask to define the Vdd and ground buses.

FIG. 10 is a sectional view of a bipolar isolation island after the field oxide formation step to define the base isolation area and the collector contact and Schottky diode areas in the epitaxial silicon layer during the fabrication of a self-aligned silicide base contact for a bipolar transistor using the process of the invention.

FIG. 10A shows a stage in the MOS process corresponding the stage of the bipolar process shown in FIG. 10.

FIG. 11 is a sectional view of the bipolar isolation island after a P type implant in order to fabricate a base region for the bipolar transistor.

FIG. 12 is a sectional view of the bipolar isolation island during an N type implant to dope a poly layer previously deposited to prepare it for formation of an emitter stripe and an emitter region.

FIG. 12A shows a stage in the MOS process after a layer of gate oxide has been grown and covered with poly and the poly is doped P type in preparation for formation of a gate.

FIG. 13 is a sectional view of the bipolar isolation island after the emitter stripe is formed.

FIG. 13A shows the source and drain implant step in the MOS process.

FIG. 14 is a sectional view of the bipolar isolation island after the emitter stripe is covered with two layers of silicon dioxide.

FIG. 14A shows a stage in the MOS process corresponding to the stage of the bipolar process shown in FIG. 14 where the two layers of oxide are formed in preparation for forming oxide spacer or shoulders around the defined poly.

FIG. 15 is an enlarged sectional view of a portion of the bipolar isolation island shown in FIG. 14.

FIG. 15A shows more detail regarding the oxide layer thickness at various corners of the poly for the MOS process.

FIG. 16 is a sectional view of the bipolar isolation island after the emitter region and the collector contact and emitter contact insulating shoulders are formed by anisotropic etching.

FIG. 16A shows the result of the anisotropic etch step to form the oxide spacers for the MOS devices.

FIG. 17 is an enlarged sectional view of a portion of the bipolar isolation island shown in FIG. 16.

FIG. 17A shows an enlarged view of the oxide sidewall spacers in the MOS process corresponding to the view of FIG. 17 in the bipolar process.

FIG. 18 is a sectional view of the bipolar isolation island after a layer of refractory metal is deposited in preparation for formation of silicide base, collector and emitter contacts.

FIG. 18A shows a comparable stage in the MOS process to the stage depicted in FIG. 18 for the bipolar process.

FIG. 19 shows the bipolar structure as shown in FIG. 18 after formation of the silicide contacts.

FIG. 19A shows the MOS device after formation of the silicide gate, source and drain contacts.

FIG. 20 is a sectional view of the bipolar isolation island after formation of the silicide contacts and formation of a metal etch protection mask.

FIG. 21 is a cross-sectional view taken along the line 21—21' in FIG. 22 showing the base and emitter region of FIG. 20 in more detail and showing the relative position of the metal etch protection mask.

FIG. 22 is a top view of the region shown in FIG. 20 showing the refractory metal etch mask alignment for a bipolar single poly device with external base and emitter contacts.

FIG. 22A shows the refractory metal etch mask alignment for the inventive MOS DRAM made using the processes of the invention disclosed herein.

FIG. 22B shows the refractory metal etch mask alignment for the inventive CMOS static RAM manufactured using the process of the invention.

FIG. 22C shows the refractory metal etch mask alignment for the MOS device of the invention manufactured using the process of the invention with extended silicide contacts for the drain and source which are external to the isolation island.

FIG. 23 is a cross-sectional view of the substrate in the bipolar isolation island after the refractory metal etch step to form the base contact conductor to the external base contact pad underlying the post and after removal of the refractory metal etch mask.

FIG. 23A is a cross sectional view through the MOS device island made with the process of the invention using the mask alignment of FIG. 22C taken along the section line 23A—23A' after the excess refractory metal has been etched away.

FIG. 24 is a top view of the various mask alignments for masks used at different levels of the bipolar structure showing the contact hole or post placement.

FIG. 25 is a top view of the completed bipolar structure using a post instead of a contact window.

FIG. 25A is a top view of the MOS device of the invention with extended silicide source and drain contacts with posts for contact to the source, drain and gate instead of contact windows, said posts being located outside the isolation island.

FIG. 27 is cross sectional diagram of one step in the modifications in the PMOS process for one embodiment of a process to make CMOS or NMOS.

FIG. 28 is the gate poly doping step for one embodiment of a process modification to make CMOS or NMOS.

FIG. 29 is the step of forming the source and drain regions in one embodiment of a process modification to make CMOS or NMOS.

FIG. 30 shows the intial stage of the preferred embodiment for the process modification to make CMOS or NMOS.

FIG. 31 illustrates the doping profile for the structure of FIG. 30.

FIG. 32 is a schematic diagram of two dynamic RAM cells illustrating two parasitic capacitances which typically affect performance of such cells.

FIG. 33 is a top view of the dynamic RAM cell of the invention made using the process of the invention.

FIG. 34 is a sectional view through the dynamic RAM cell of FIG. 28 taken along the view line 29—29' in FIG. 28.

FIG. 35 is a top view of an array of dynamic RAM cells like that shown in FIG. 28 made using the process of the invention.

DETAILED DESCRIPTION OF THE PREFERRED EMBODIMENT

Referring to FIG. 1 there is shown the plan view of the layout of the static RAM cell of the invention made using CMOS devices of the invention manufactured in accordance with the process of the invention. FIG. 1 will be best understood by simultaneously referring to FIG. 5 which gives the schematic diagram for the CMOS static memory cell of the invention, and FIGS. 2-4 which detail the structure of the cell in various cross sections taken along view lines in FIG. 1 marked 2—2', 3—3' and 4—4' corresponding to FIGS. 2-4 respectively. In FIG. 5, the transistors Q3 and Q4 are P channel devices (hereafter sometimes referred to as PMOS) as symbolized by the arrows coming out of their gate nodes, while transistors Q1, Q2, Q5 and Q6 are N channel MOS devices (sometimes hereafter referred to as NMOS) in the preferred embodiment. The situation could be reversed however with Q1, Q2, Q5 and Q6 being PMOS and the remaining devices being NMOS.

The gate of each transistor is marked with a G followed by the number of the transistor. Likewise for the sources which are marked with S's followed by the transistor number and the drains which are marked by D's and a number. These electrodes for the transistors are marked in FIG. 1 with the letters and numbers identifying the corresponding node type and transistor number in FIG. 5. In the plan view of FIG. 1, the cross-hatching for gates such as G4 is dots which represent polysilicon (sometimes hereafter referred to as poly) and the cross hatching for the sources and drains in the herringbone pattern is used to represent silicide. The key for the crosshatching for the other materials used in the cell construction is adjacent to FIG. 1.

The structure of a typical MOS transistor of the invention as used in the cell of the invention is illustrated in FIG. 2 which is a cross section through the transistor Q4, and the Vdd post connections 10 and 12 and the shared nodes A and B. The transistor Q4 is comprised of a gate G4 comprised of a poly electrode 14, which is doped either N+ or P+ depending on the desired threshold and the type of the channel, gate oxide 18 and a silicide covered source 26 and a silicide covered drain 28. Actually all the gate poly for all the transistors could be doped N+ regardless of the channel type since the threshold can be manipulated many other ways such as by changing the doping level of the epitaxial silicon (hereafter "epi") 16 or changing the oxide thickness for the gate oxide 18 as well as other ways known to those skilled in the art. The gate poly 14 has its top surface covered with a self aligned layer 20 of silicide, and has the sides of the poly insulated from adjacent structures by a pair of oxide shoulders 22 and 24.

The drain and source, D4 and S4 respectively, of transistor Q4 are doped portions of the N type epi 16. Preferably, the source and drain regions are ion implanted with P type impurities so that the edges of each will be self aligned with the edges of the gate poly with very little if any underhang under the gate G4. Underhang would increase the source to gate and drain to gate capacitance. If there was any separation between the edge of the gate poly and the edges of the source and drain regions there would be an increase in the channel resistance. However, these regions D4 and S4 could also be diffused regions in other embodiments.

The top surfaces of all the source and drain regions of the transistors of the memory cell are covered with silicide starting at the edge of the oxide spacers or shoulders 22 and 24. In the case of Q4, these silicide layers are shown at 26 and 28. The purpose of these layers is to reduce the resistance of the source and drain regions of the MOS transistor and to form part of the extended silicide contact structure which extends via a refractory metal conductor such as the conductor shown at 30 to a location external to the isolation island of the transistor Q4. The isolation island of the transistor Q4 is outlined by the phantom line 31 in FIG. 1. Likewise, the isolation island for each transistor in the cell is outlined in phantom in FIG. 1. The conductor 30 forms a contact pad for support of and electrical contact with a metal post 12. In the case of S4, this post 12 is for connection to the Vdd bias voltage supply. Each contact to the cell from the outside world is made through one of these posts. Each post is located outside the isolation island of every transistor in the cell and is connected to the necessary source or drain contact for the desired transistor by a layer of refractory metal. This layer of refractory metal lies atop the field oxide and extends into the isolation island of the desired transistor. There, the refractory metal makes electrical contact with the silicide covering the source or drain contact that needs to be in electrical contact with the outside world.

The silicide layer 26 contacts a refractory metal conductor B which forms the shared node B in FIG. 5. The post type via 10 and its refractory metal support and contact pad 32 form a part of the extended contact structure of the S3 source of Q3 as seen best in FIG. 1.

The silicide layer 20 on top of the G4 gate poly makes electrical contact with a refractory metal conductor shared node A which can be better seen in FIG. 4. The shared nodes A and B are actually combined areas of silicide and unreacted refractory metal from which the silicide was formed which is in electrical contact with the silicide.

The drain and source regions of Q4 are bounded by field oxide 34 as are the sources and drains of all the transistors. The field oxide 34 forms an isolation island around each of the 6 transistors. The boundaries of each isolation island are indicated by phantom lines in FIG. 1. Although these boundaries for the isolation islands are actually coincident with the boundary line of the source and drain regions, they are shown just outside these boundaries in FIG. 1 for clarity of illustration. The gate of Q4 is connected by a layer of silicide and refractory metal forming the shared node A to the gate of Q2 and to the source of Q5.

Below each PMOS device is a buried layer 36 of N. doped substrate. This buried layer helps drain charge on alpha particles that penetrate the cell. The epi layer 16 must be thick enough to prevent punch through to the buried layer 36.

Covering the entire cell structure except the tops of the posts 10 and 12 is a planarized layer 42 of any of the known intermetal insulation layers capable of being planarized prior to deposition of a first layer of metal from which a first conductive pattern will be etched. There are two separate layers of metal conductors to be used in the cell of the invention to contact the tops of the single height posts 38 and 40 and the tops of the double height posts 44, 46, 10 and 12 respectively. These two layers must be insulated from each other. This is the purpose of a second insulation layer 43 which is planarized prior to the second layer metal deposition.

The first insulation layer 42 is deposited over the gates, refractory metal conductors and the posts and etched back to expose only the tops of the single height posts. In other embodiments, the first insulation layer may be formed so as to expose only the tops of the single posts without the need for an etchback step. The first layer metal is then deposited atop the first layer of insulation 42 and contains the bit line conductors which are etched so as to contact the memory cell by making contact with the single height posts 38 and 40. The orientation of these bit lines relative to the cell is shown in FIG. 8 to be described in more detail below. The second layer of insulation 43 covers the first metal conductive pattern and is selectively etched back or formed so as to leave only the tops of the double height posts exposed.

The second layer of metal conductors lies atop the planarized surface of the second insulation layer 43 and contains the Vdd and ground buses. The orientation of these lines can be visualized by reference to FIG. 9 to be described in more detail below. These buses are connected to the cell by making contact with the exposed tops of the 4 double height posts.

Referring to FIG. 3, there is shown a cross section of the cell through the transistors Q6, Q1 and Q3. A bit line 0 on the first metal conductor layer rests on and is in electrical contact with the metal post 38. The post 38 rests on and is in electrical contact with a refractory metal conductor 48. This conductor extends over the edge of and makes electrical contact with a silicide layer 50 formed on top of the drain D6 of transistor Q6. In the preferred embodiment, both D6 and S6 are self aligned, ion implanted N type epi regions in a layer of P type epi 52 formed on top of the N type epi 16 which is formed on top of the buried layer 36. The P type epi is a former N type epi region which has had its doping changed in a manner which will be described later during a description of the process to make the NMOS transistors of the cell. FIG. 3 shows the preferred structure for the NMOS transistors of the cell using a P channel stopper 37 under the NMOS isolation islands instead of an N+ buried layer. This converts the N type epi to P type epi by outdiffusion as will be described below. Other embodiments for the structure for the NMOS devices will be apparent from the description of the various processes which are possible to make the NMOS devices.

The source region S6 of Q6 also has formed thereon a silicide layer 54. Between the D6 and S6 regions, and on top of the P type epi 52 there is formed a thin gate oxide 56 over which is deposited the gate poly 58 of the transistor Q6. The gate poly 58 has a layer of silicide 60 formed over it to reduce the resistance of the poly 58. Together, the poly 58 and the silicide layer 60 form the word line in FIG. 5 connected to the gates of transistors Q5 and Q6. The gate poly 58 has silicon dioxide shoulders 62 protecting it from encroaching refractory metal or silicide to prevent shorts which would destroy transistor action.

The silicide layer 54 over the drain region of Q6 is in electrical contact with the refractory metal conductor B which itself is in electrical contact with a silicide layer 64 formed over a common poly layer 66 which forms a shared gate for transistors Q1 and Q3. This common gate has separate gate oxide layers 68 and 70 for each transistor and a single shared silicon dioxide insulating collar 72 which is not necessary, but which may be present without any harm. An extension B' of the shared node conductor B extends to the right of the gates G1 and G3 to provide a location for the contact between the conductor B and the silicide layer on the drain D4 of the transistor Q4.

FIG. 4 shows a cross sectional view of the cell of FIG. 1 taken through the transistors Q5, Q2, Q4 and the shared node A. The structure is similar to and the crosshatch coding is the same as in FIG. 3. Interpretation of the drawing of FIG. 4 will be apparent to those skilled in the art in light of the discussion of FIG. 3 and when considered in light of FIGS. 1 and 5.

FIG. 5 shows a well known circuit for a CMOS static RAM cell and further discussion is not warranted.

FIG. 6 illustrates a four column by two row memory array comprised of 8 cells structured in accordance with the invention. Cell number 1 is enclosed in phantom lines for convenience in identification. The word lines 60 pass through the array at the poly and silicide level, while the bit line 0 and 1 pass overhead on metal level 1 making contact with single height posts 38 and 40. Using two micron design rules where everything is two microns wide and two microns high and spaced by two microns, the dimensions of each cell are 12 microns by 26 microns for a total four column by two row array size of 2448 square microns. The drawings of FIGS. 1 and 6 are not drawn to scale.

FIG. 7 shows the layout of the post mask for defining the areas of the refractory metal layer to become the various posts used in the cell. The areas 38' and 40' will be used to protect the photoresist over the refractory metal from exposure to light in the areas to become the bit line 0 and bit line 1 posts. The areas 10' and 12' are the areas which will become the Vdd posts 10 and 12. The areas 44' and 46' are the locations for the ground bus posts 44 and 46. The manner of use of the mask will be apparent to those skilled in the art.

FIG. 8 shows the layout of the first metal mask to define the bit lines in the first metal interconnect layer. This mask is shown in its aligned position over the post mask of FIG. 7. The areas 38" and 40" are the locations where the tops of the posts 38 and 40 make electrical contact with the two bit lines 0 and 1 which are defined in the first layer metal by the masking areas 74 and 76.

FIG. 9 shows the layout of the second metal interconnect layer mask in aligned relation with the post mask of FIG. 7 and the first metal mask of FIG. 8. The masking area 78 defines the area in the second metal layer which will become the ground bus which makes contact with the posts 44 and 46 in FIG. 1. The locations 44" and 46" are the areas of this contact. The masking area 80 defines the area in the second metal layer which will become the Vdd bus which makes contact with the posts 10 and 12 in FIG. 1. The areas 10" and 12" are the locations of those contacts. Because the posts 44, 46, 10 and 12 are double height posts as compared to the posts 38 and 40 which are single height, and because there is an intervening layer of planarized insulating material, 43 in FIG. 2, the ground and Vdd buses do not make electrical contact with the bit lines on the first metal layer.

Turning to the process for making the cells of the invention, the following is a summary of the process steps for forming bipolar and P channel MOS devices on the same die. This is the process illustrated in the process sequence drawings beginning with FIG. 10.

1. Form an N+ buried layer in the P− substrate (optional for MOS devices).
2. Grow a layer of N− doped epitaxial silicon over the buried layer.
3. Form the isolation island for each transistor using any known process, but preferably using the Fairchild Isoplanar ™ process and form P+ channel stoppers under certain field oxide regions.
4. Grow a gate oxide over all MOS device islands—mask off the device islands of all bipolar devices.
5. Deposit poly by any known process.
6. Dope the poly N+ with N type impurities at all NPN transistor locations—mask off all other islands.
7. Dope the poly P+ with P type impurities for all P channel locations.
8. Mask and etch the poly to define all the gates, emitter stripes and collector contacts.
9. Dope the sources and drains of all P channel MOS devices with P type impurities.
10. Grow approximately 500 angstroms of thermal oxide over all exposed poly and epi surfaces.
11. Deposit approximately 3000 angstroms of LPCVD oxide over the thermal oxide.
12. Anisotropically etch the oxide to remove oxide on all horizontal surfaces but leave oxide on vertical surfaces to form protective shoulders of oxide covering the sides of the poly gates, emitter stripes and collector contacts.
13. Deposit 300 angstroms of titanium or other refractory metal everywhere.
14. Deposit 1000 angstroms of tungsten everywhere (optional).
15. Heat to a high enough temperature to form titanium silicide but lower than the reaction temperature of tungsten silicide.
16. Mask and etch the refractory metal to remove unreacted metal from certain areas.
17. Deposit a very thick layer of photoresist and mask and expose it to radiation everywhere except at the locations of single height post vias then develop photoresist to leave deep holes everwhere a single height post is to be formed.
18. Deposit a layer of post metal all over the die to the thickness of the single height posts.
19. Dissolve the photoresist to lift off the post metal everywhere except at the locations of the posts.
20. Deposit a very thick layer of photoresist and mask and expose it to radiation everywhere except at the locations of double height post vias then develop photoresist to leave deep holes everwhere a double height post is to be formed.
21. Deposit a layer of post metal all over the die to the thickness of the double height posts.
22. Dissolve the photoresist to lift off the post metal everywhere except at the locations of the posts.
23. Deposit a first insulation layer by low pressure chemical vapor deposition of silicon dioxide or some other suitable insulating material and spin on a planarizing layer of photoresist, bake to harden photoresist.
24. Etch back to expose the tops of single height posts with an etchant that will attack only the insulation material and photoresist but not the metal of the posts.
25. Deposit first metal and etch to form first interconnect layer contacting tops of single height posts.
26. Deposit, for intermetal insulation, a second insulation layer of low pressure chemical vapor deposition oxide or other suitable insulation material and spin on a planarizing layer of photoresist, bake to harden photoresist.
27. Etch back to expose tops of double height posts with an etchant that will attack only the insulation material and photoresist but not the metal of the posts.
28. Deposit second metal layer and etch to form second interconnect layer contacting tops of double height posts.

There follows a step by step description of the above process for making PMOS and bipolar devices on the same die described in a side by side comparison format.

The bipolar transistor made by the process as described herein has a smaller base region and, therefore it has a smaller active area and a smaller cell size than is found in the prior art. This results in reduction of the junction areas of the parasitic capacitors that normally afflict bipolar integrated transistors. It also results in a reduction in the extrinsic base resistance of the bipolar transistor. The result of these improvements is a bipolar transistor with a higher cutoff frequency and faster switching speed.

A similar advantage exists for the MOS structures made with the process of the invention. Because there need be no contact windows within the perimeter of the isolation island, the source and drain regions may be made smaller. This reduces the junction areas of the parasitic capacitors associated with the source/substrate and drain/substrate junctions thereby reducing the capacitance of these parasitic capacitors and speeding up device operation.

The process for forming this structure is self aligned. That is, the transistor uses a self-aligned metal silicide over a poly base contact and a self aligned, narrow insulation spacer between the base contact and the emitter contact. The insulation spacer is a very thin layer of silicon dioxide that insulates the side walls of the emitter contact from the base contact.

There is a layer of silicide that provides a conductor that covers the upper surface of most of the base region. The base contact window is connected to this layer of silicide by a layer of refractory metal that extends to a base contact pad and post type via which lies outside the boundaries of the isolation island of the cell. This is best visualized by reference to FIG. 25 which shows the final bipolar structure in plan view after manufacture by the process to be described in detail next.

The emitter contact is also a post type via which lies over a silicide covered poly extension of the emitter poly stripe to a location outside the isolation island of the cell.

These elements will be described in more detail in conjunction with the description of the process which follows. Although the structure and process are described in terms of an n-p-n bipolar transistor formed on a p-silicon substrate, the bipolar process can also be used to make PNP transistors.

An aspect of the invention of major importance is a new static CMOS memory cell layout and a new MOS DRAM cell layout made using the MOS transistor structure of the invention which in turn are manufactured using the process of the invention for making high performance MOS and bipolar devices with extended silicide contacts on the same die. The bipolar devices can be built essentially for "free" using the process to make the MOS devices. These bipolar devices can be used to fabricate fast decoders, sense amplifiers and other support circuitry needed to make a complete memory system. The overall system can then be faster than an all MOS system since the critical paths in terms of system speed can be fabricated with small, fast bipolar devices. Simultaneously, the memory cell array can be made very dense with very small MOS devices and compact cells which minimize the need for contact windows and the concomitant need for the space necessary to enclose a contact window and the alignment tolerances around it.

FIG. 10 is a sectional view of a semiconductor substrate in an area where a bipolar device is to be formed after the field oxide formation step to define the base isolation area and the collector contact isolation area. An isolation area to form a Schottky diode in the epitaxial silicon layer during the fabrication of a self-aligned bipolar transistor is also shown. A lightly doped P− silicon substrate 110 of <100> surface orientation provides the underlying semiconductor material of the wafer. A heavily doped n+ region is diffused or implanted into the upper surface of substrate 110 and forms an n+ buried layer 112. On either side of each buried layer under a bipolar device isolation island, there is formed by conventional methods a P+ channel stopper region 37 to prevent formation of spurious MOS transistor channels between buried layers of adjacent bipolar transistors. On top of buried layer 112 a monocrystalline silicon lightly doped n− region 114 is epitaxially grown. Next, field oxide regions 116, 118, 120, and 122 are formed by the following Isoplanar TM process: The Isoplanar process is summarized as follows and is well known in the semiconductor processing industry: (1) the upper surface of the substrate is coated with silicon nitride; (2) portions of the silicon nitride are patterned photolithographically and removed from areas where oxide barriers are desired; (3) the epitaxial layer 128 is anisotropically etched to form pockets with slanted side walls; (4) the pockets are filled by thermally grown silicon dioxide which grows upon the side walls and bottom surfaces of the pockets; and (5) all residual silicon nitride is removed. The foregoing process steps are well known in the art and described in U.S. Pat. No. 3,648,125 issued to Doug Peltzer. Of course, other well known techniques for formation of isolation islands may be used as well such as trench etching and filling or other techniques described in Hamilton and Howard, "Basic Integrated Circuit Engineering, (1975) McGraw Hill, New York the disclosures of which are hereby incorporated by reference. Further description of the well known semiconductor processing techniques mentioned herein will be found in Sze, "VLSI Technology" (1983) McGraw Hill, New York and Elliott, "Integrated Circuit Fabrication Technology" (1982) McGraw Hill, New York the disclosures of which are also incorporated by reference.

The field oxide regions divide the epitaxial layer into three separate islands 124, 126 and 128. Hereafter, all references to oxide and oxide material should be interpreted as references to silicon dioxide.

FIG. 10A illustrates the corresponding stage in the process to make P channel MOS device. Structures in the MOS device corresponding to to similar structures in the bipolar device are shown with the same reference numeral with a prime symbol "'". Although MOS devices are self isolating isolation islands are used in the process described here because they can be made essentially for "free". That is, these isolation islands are necessary for the bipolar devices. There are certain advantages of making MOS devices in isolation wells where CMOS is to be manufactured as will be described later. For one, use of isolation islands eliminates a separate process step to create a P well in locations where NMOS devices are to be created adjacent to PMOS devices. Another advantage in using isolation islands for MOS devices is that the junction capacitance of the PN junction of the P well and the N− epi in no isolation island CMOS is eliminated thereby speeding up CMOS circuits fabricated with the process of the invention. The differences of the CMOS process from the process described in this section will be detailed later herein.

Forming the field oxide regions in the manner described above creates an uneven upper surface. This happens because the oxide grows equally from all exposed silicon surfaces, which includes both the side walls and bottom surfaces of the pockets. Humps 130 in FIG. 10, commonly known as bird's heads are formed at the sidewalls of the pockets. Subsequent processing steps can be performed with more accuracy, and with finer precision, if the bird's heads are removed to form a planar upper surface of the wafer. Although removal is not mandatory, it is recommended lest the bird's head bulges be reflected throughout the higher layers of the final structure thereby hindering planarization or rendering it impossible. One technique for creating a planar upper surface is disclosed in U.S. patent application Ser. No. 576,665, filed Feb. 15, 1984, entitled "Semiconductor Planarization Process and Structures Made Thereby" invented by Greg Burton, and assigned to Fairchild Camera and Instrument Corporation.

FIG. 11 shows the bipolar structure after planarization and after a first masking stage in preparation for forming the emitter and base regions. After planarization down to the flat surface of the epitaxial layer, a thin thermal oxide layer 132 is grown over epi islands 124, 126, and 128 (the oxide over the island 128 has been removed in a subsequent step to be described below at the stage shown in FIG. 11). The thickness of oxide layer 132 is not critical since it is used only as a shield during subsequent ion implantation. A photomask layer 134 is photolithographically formed over selected portions on the upper surface of the wafer to form an opening around the epi isolation island 128. Next, that portion of the thermal oxide layer 132 that is located above island 128 is removed by etching. Oxide layer 132 remains in place over islands 124 and 126 to leave the structure as shown in FIG. 11. Then, island 128 is ion implanted with P type impurity atoms, such as boron. The impurity atoms form a lightly doped P− base region 136 on top of the remaining N− epitaxial region 138 of island 128.

In reference now to FIG. 12, the formation of the emitter region for the bipolar devices will be described. First, the photomask layer 134 and the thermal oxide layer 132 are removed by conventional techniques. Then, a layer of polycrystalline silicon 140 is deposited, for example, by chemical vapor deposition, on top of the wafer to a thickness of approximately 2500 to 5000 angstroms. N type impurity atoms are present during the formation of the poly layer 140, causing it to be a lightly doped N− material. Next, an oxide layer 142 is grown on top of the polycrystalline silicon layer. Oxide layer 142 is then photolithographically patterned to expose portions of the polycrystalline silicon layer 140 overlying the diode, base and collector contact areas. Portions of oxide layer 142 remain to cover the remaining portions of the polycrystalline layer 140 that will later form the resistive elements of resistors. Next, the exposed portions of the polycrystalline silicon are ion implanted with N type impurity atoms to form a heavily doped N+ layer of poly over selected regions of the bipolar transistor. The N type impurity atoms may be, for example, arsenic atoms. FIG. 12 shows the state of the wafer during the N type implant. The islands for the PMOS devices must be masked during the P implant of FIG. 11 and the N implant of FIG. 12.

FIG. 12A shows the PMOS device at this stage of the process and illustrates some additional steps not necessary in the bipolar process. First, the mask over the PMOS island must be removed and a layer of thermal gate oxide 139 must be grown. In the preferred embodiment, this gate oxide is 300 angstroms thick. This gate oxide must be grown before the polysilicon deposition step of FIG. 12 is performed. Then the poly layer 140′ is deposited at the same time as the poly layer 140 was deposited in the step illustrated in FIG. 12. The poly layer 140 may optionally be deposited without any dopant present so that it remains intrinsic after deposit until its conductivity is changed by the implants of FIGS. 12 and 12A. The oxide layer 142 is allowed to grow over the poly layer 140′ when it is grown in the step of FIG. 12 and is shown at 142′ in FIG. 12A. When the oxide layer 142 is patterned in FIG. 12 it is also patterned in FIG. 12A to expose the poly for a P type implant. If this patterning of the oxide layer 142′ over the PMOS device island is done, a separate masking step must be performed to form a mask over the PMOS island during the N type implant for the bipolar devices shown in FIG. 12. Preferably, the oxide layer 142′ is not patterned to expose the poly layer 140′ over the PMOS island at the same time that the oxide layer 142 over the bipolar island is patterned. This allows the oxide layer 142′ to serve as the implant mask during the bipolar N type implant shown in FIG. 12. Of course the oxide thickness of the layer 142′ and the implant energy of the N type implant must be such that the oxide layer 142′ will be an effective implant mask. After the N type implant for the bipolar device shown in FIG. 12, the oxide layer 142′ can be etched to expose the poly 140′ over the PMOS isolation island. Next, a P type implant is performed in FIG. 12A at the locations of all PMOS devices. In other embodiments, the oxide layer 142′ may be patterned at the same time as the oxide layer 142 over the bipolar device is patterned. The poly layer 142′ is then doped N+ during the same N type implant as shown in FIG. 12. Since the poly layer 142′ will ultimately form the gate contact for the PMOS device, the P channel transistor will have an N+ gate contact. This alters the threshold voltage of the transistor, but the threshold voltage may be tailored to the desired level in other well known ways. The threshold can be corrected or adjusted by changing the oxide thickness or changing the doping level of the epi 128+. This embodiment simplifies the process for making the PMOS devices.

Referring to FIG. 13, another photolithographic step is next performed to define an emitter contact stripe 150 and the collector and resistor taps. To accomplish this, another photomask layer 144 is applied to the top of the wafer. Photomask 144 is patterned to expose portions of the polycrystalline silicon layer 140 to be etched away to define the emitter and collector contact stripes. The exposed portions of the polycrystalline silicon layer are then etched away, leaving four N+ regions 146, 148, 150, and 152. These regions are shown in FIG. 13 as still covered by the masking material of the etch mask that defined them. N+ regions 146 and 152 form resistor bodies, N+ region 148 forms a collector contact, and N+ region 150 forms an emitter contact. All of the N+ poly regions have substantially vertical side walls because an anisotropic etching process is preferred, although isotropic processes may be employed.

A corresponding stage in the MOS process is shown in FIG. 13A. A mask layer of photoresist 144′ is defined to outline the gate poly 141. An anisotropic etch etch which formed the structure of FIG. 13, is used to etch away all the exposed poly 140′ except the gate poly which will now be referenced as gate contact 141. For the DRAM cell structure to be described below, this same etch is used to define the shape of the poly plate used as one plate of the storage capacitor for the cell. This etch also etches away the gate oxide everywhere except under the gate poly (and under any capacitor locations for DRAM cells).

At this point an additional step for the MOS process is needed in the form of an implant to form the source and drain regions for the PMOS device. Using the gate poly and photoresist as an implant mask, P type impurities are implanted into the epi 128' to form source and drain regions 145 and 147 which have their edges self aligned with the edges of the gate poly.

Referring to FIG. 14 in the bipolar sequence, at this point, the emitter contact stripe 150 extends upward from the upper surface of the base region 136. To form the transistor, an N+ emitter region must be created within the monocrystalline P— type base region 136. To accomplish this, the wafer is heated so that some of the N+ impurities of the emitter contact stripe 150 diffuse downward into the base region 136. This downward diffusion forms an N+ emitter region 154 within the monocrystalline base region 136 of the substrate. This heating step can be combined with the annealing step for the P and N type implants previously completed in the MOS sequence.

The formation of a double oxide layer over the whole wafer is the next step in the process of the present invention, and is illustrated in FIGS. 14 and 14A. After removal of the remaining photoresist 144, an oxide layer 156 of approximately 500 to 1000 angstroms thickness is thermally grown from the exposed silicon surfaces of the wafer. Then, another oxide layer 158 of approximately 1500 angstroms thickness is deposited on top of oxide layer 156 preferably by chemical vapor deposition.

FIG. 15 shows the base and emitter regions 136 and 154 and coverage of the emitter contact stripe 150 by the oxide layers 156 and 158 in more detail. FIG. 15A shows the coverage of the gate poly 141 in greater detail. The description of the formation of oxide shoulders around the gate and emitter poly below applies equally to the coverage of any poly used for the top plates of storage capacitors for DRAM cells of the invention being formed with the process described here.

Oxide layer 156 is thicker at inside corners 157 and 159 and is thinner at outside corners 161 and 163. The oxide layer 156 is of some thickness lying between these two extremes along the flat surfaces such as on top of the emitter contact stripe 150 and over the source and drain regions and on top of the gate poly 141. This thickness deviation occurs because the rate of oxide growth from all silicon surfaces is uniform. This causes the oxide to pile up in the inside corners, and spread out from the outside corners.

It has been found to be advantageous to use a composite of two layers of oxide when forming oxide insulating shoulders. The oxide layers serve two distinct functions. First, the oxide shoulders 160 and 162 (described below and sometimes referred to hereafter as spacers or spacer oxide) will be formed from the inner oxide layer 156, so electrical integrity as an insulator is critical. Since oxide layer 156 is thermally grown, it has a high degree of electrical integrity with virtually no pin holes. Second, as to the second layer of CVD oxide, an anisotropic etching process is used to form the spacer oxide, and for the etching step to work properly, a thicker oxide layer than is readily formed thermally is required. Although the inner oxide layer 156 could be grown to sufficient thickness, it is quicker to deposit the outer oxide layer 158 by LPCVD or CVD to form an oxide layer of the requisite thickness rapidly. The lower integrity of deposited oxide layer 158 does not impair the anisotropic etching process or the quality of the spacer oxide. In other embodiments of the process, layer 158 may comprise a refractory insulating material such as silicon nitride.

The next step of the process is to form by anisotropic etching the emitter contact-base contact spacer oxide and the spacers around the gate oxide as illustrated in FIGS. 15 and 15A. Anisotropic etching is an etching process that preferentially etches in a vertical direction. In other words, its vertical etching rate is much greater than its horizontal etching rate. In the preferred embodiment of the present invention, anisotropic etching is performed by reactive-ion etching, a commonly used anisotropic etching process. Reactive-ion etching has the added advantage of a high silicon-to-silicon dioxide etch ratio, so that the desired removal of silicon dioxide occurs at a far faster rate than does the undesired removal of silicon. The reactive-ion etching of silicon dioxide over silicon is well known and may be carried out using commercially available equipment.

Anisotropic etching continues until all oxide is removed from the horizontal upper surfaces of the wafer. The etching process exposes the horizontal upper surfaces before it reaches the vertical side walls because the vertical thickness of the oxide is thinner above the horizontal surfaces than above the inside corners 157 and 159, and because the etching action is vertically preferential. The final results are shown in FIGS. 16, 16A, 17 and 17A. When the oxide from oxide layers 156 and 158 has been removed from the horizontal upper surfaces of the wafer, a residual amount of oxide remains on the vertical side walls of all the defined poly regions such as the gate poly 141, the top plate poly of storage capacitors for DRAM cells (not shown) and the bipolar poly contact regions, i.e., N+ regions 146, 148, 150, and 152. The residual oxide 160 and 162 the side walls of the emitter contact region 150 is the spacer oxide that will insulate between the emitter and the base contacts. The spacer oxide is thin near the upper surface of the emitter contact region, and increases in thickness toward the upper surface of the base region, and the same is true for the poly regions in the MOS devices.

The thickness of the spacer oxide is controlled by the anisotropic etching process, and is not controlled by the limits of the photolithographic process. That is, the thickness of the spacer oxide is not limited by the alignment precision of the photolithography equipment. Three parameters control the thickness of the spacer oxide layer: vertical-to-horizontal etching ratio, duration of the etching process, and thickness of oxide layers 156 and 158. An anisotropic etching process with a lower vertical-to-horizontal etching ratio will form thinner spacer oxide layers than a process with a higher ratio. Also, increasing the duration of the etching process will form thinner spacer oxide layers. It has been found, for example, that a spacer oxide thickness of 2000 to 3500 angstroms at the upper surface of the base region is readily achieved.

FIGS. 18 and 19 illustrate the next steps in the bipolar process to form the silicide base contact. FIGS. 18A and 19A illustrate the next step in the PMOS process to form the silicide source and drain contacts. First, a thin layer 165 of a refractory metal described in more detail below, is deposited on the wafer as shown in FIG. 18 and FIG. 18A. The thickness of this metal layer 165 in the preferred embodiment is 500 to 1000 angstroms. The wafer is then heated to an elevated temperature for a time sufficient to form electrically conductive metal silicide. Metal silicide is a binary compound of silicon and a metal, and is formed at the elevated temperature wherever metal atoms are in contact with silicon atoms. Metal silicide does not form where the metal layer contacts the oxide regions. As indicated in FIG. 19, metal silicide does form on the polycrystalline silicon upper surfaces of N+ regions 146, 148, 150, and 152, as well as on the epitaxial silicon upper surface of diode N− region 124, and on the silicon upper surface of the base P− region 136. As seen in FIG. 19A for the MOS sequence, the silicide forms on top of the gate poly 141 and on top of the doped epi source and drain regions 145 and 147. The silicide thus formed is shown at 164, 166, 168, 170, 172, 174, and 176 in FIG. 19 and at 171, 167 and 169 in FIG. 19A. Importantly, a metal silicide is in electrical contact with the refractory metal from which each silicide region was formed. The refractory metal extends over the field oxide regions and is available to be patterned as a "free" interconnect layer. Silicide does not form on top of the field oxide regions 116, 118, 120, and 122, nor does it form on the spacer oxide shoulders 160 and 162 in FIG. 19.

In FIG. 19A the silicide does not form over the field oxide regions 120′ and 122′ and it does not form over the oxide spacer shoulders 160′ and 162′. The same is true for all other exposed epi or poly with spacers elsewhere in the circuit such as the poly defining the top plates of storage capacitors for the DRAM cells of the invention. The portions of the refractory metal which do not react to form silicide are indicated with reference numeral 165 in FIG. 19 and 165′ in FIG. 19A.

The metal used to form the silicide layers may be chosen from a wide range of candidates. If no subsequent high temperature processing is required, then nickel, palladium, or platinum may be used. If subsequent processing at a high temperature is required, such as is needed to flow a layer of reflow oxide, then a refractory metal such as titanium, vanadium, chromium, zirconium, niobium, molybdenum, hafnium, tantalum, or tungsten is preferred. The preferred embodiment uses a layer 165/165′ of refractory metal which is laid down in a two layer sandwich. The bottom layer closest to the substrate is titanium. The top layer is 1000 angstroms of tungsten.

After depositing the refractory metal, a heat pulse treatment to form the silicide is performed at a temperature which is high enough to form titanium disilicide but not tungsten disilicide. In other embodiments any of the refractory metals may be used alone or in combination with other refractory metals. The heat pulse treatment can be at a low temperature such as 400 degrees centigrade for a time long enough to convert all or some of the refractory metal to silicide. Care must be taken however to prevent "crawl out" of silicon from the gate, emitter or other poly over the shoulders thereby causing silicide to form over the shoulders and short the poly to other structures such as the epi of the base region or of the source and gate regions. One way of eliminating this problem is to use the Rapid Thermal process by exposing the structure to a temperature from 900 to 1200 degrees centigrade for from 3 seconds to 3 minutes. Preferably the temperature is 800 to 850 degrees centigrade for approximately 10 seconds. The short time at high temperature minimizes the diffusion of silicon atoms over the spacer oxide and eliminates the formation of a short over the spacer oxide. Another way of controlling crawl out is to use a nitrogen ambient ambient atmosphere for a heat pulse using a tungsten-halogen heat source. Such a method is described in detail in U.S. patent application "Method for Controlling Lateral Diffusion Of Silicon In A Self Aligned $TiSi_2$ Process" Ser. No. 634,937, filed July 27, 1984, now U.S. Pat. No. 4,567,058 and commonly assigned to the assignee of this invention which application is hereby incorporated by reference.

An additional step of ion implantation may be performed before heat treatment to improve the formation of silicide. That is, silicon atoms may be ion implanted into the metal layer 165/165′ utilizing an implant energy level that embeds the ions generally at the interface between the metal and the underlying silicon. Silicide is formed at the interface by the implanted silicon atoms. The implantation allows more uniform silicide formation during subsequent heat treatment steps.

Since the unconverted metal 165 is in self-aligned electrical contact with the silicide over the base region 136, portions of this metal layer 165 can advantageously be used as a conductor making contact with the silicide base contacts 174 and 176 if the metal layer 165 is properly patterned.

The same is true for the unreacted metal 165′ in the MOS structure, i.e., it is self aligned with the edges of the source and drain regions and in electrical contact with the silicide source and drain contacts. The next step is to form an etch protect mask of photoresist to protect the refractory metal during a metal etch step. Metal layer 165/165′ then is etched to form the desired interconnect pattern be formed.

As to the bipolar device, it is desired to protect those portions of the metal layer 165 that are in electrical contact with the silicide base contacts 174 and 176 but to etch away all other portions of the metal layer 165. Further, the retained portions of the metal layer 165/165′ which are left in contact with silicide base contacts must be configured so that the base contact window can be formed outside the confines of the isolation island for the emitter and base regions of the bipolar transistors and the drain to bit line contact in the MOS DRAM.

In the MOS device, it is desired to retain the metal in contact with the source and drain silicide. Also in the case of the MOS static RAM, it is desired for some transistors, such as Q2, Q4, Q1 and Q3, to leave the metal in contact with the silicide on top of the gates to form shared nodes. In the case of the MOS DRAM to be discussed below, the refractory metal etch mask must be configured to leave in place the refractory metal in contact with the drain silicide contact and to etch in that refractory metal a conductor to the position of the contact pad external to the transistor isolation island for the post via to the bit line metal.

The refractory metal etch mask must be configured so that the unreacted metal over the spacer oxide shoulders 160′ and 162′ is removed on all the bipolar and MOS devices. This is necessary to prevent shorts between the gates of the MOS devices and their source and drain contacts and to prevent shorts between the emitter electrodes and the base contact silicide on the bipolar devices. Thus, the refractory metal etch mask must leave exposed to the etchant the gate electrodes and their oxide shoulders of the MOS devices, and for the bipolar devices, it must leave exposed to the etchant the emitter stripes and their oxide shoulders.

FIG. 20 illustrates in cross section, the refractory metal etch mask used to accomplish this configuration of the metal layer 165/165′. To form this etch mask, a layer of photoresist (not shown) is deposited on the wafer in any known manner. Then a mask having the desired configuration is aligned over the wafer, and the photoresist layer is exposed to an ultraviolet radiation source to polymerize the exposed portions of the photoresist. After polymerization of the photoresist, the unpolymerized resist is removed by known solvents leaving only the polymerized portions of the resist on the wafer. The mask alignment must be such that the photoresist which is left on the wafer is positioned as shown in FIG. 20 at 175 and 177. Note that the resist covers a portion of the base contact silicide 174 and 176 and extends to cover portions of the metal layer 165 that are in electrical contact with the base contact silicide 174 and 176.

In the MOS case, FIG. 20A shows the relative positions and alignments of the refractory metal etch mask photoresist portions 175' and 177' prior to the etch step to remove the unreacted refractory metal. The unreacted refractory metal is shown at 165'. Note how the refractory metal etch mask photoresist extends from a point over the source and drain silicide contacts 171 and 169 to a point over the field oxide regions. This will define a conductive layer in the refractory metal layer 20 after the etch step which will be in electrical contact with the source and drain silicide contacts and can extend to the location of a contact pad outside the isolation island for the MOS device.

An expanded cross sectional view of the base region 136 of the bipolar transistor cell shown in FIG. 20 is shown in FIG. 21 to more clearly indicate the relative position and alignment of the refractory metal layer 165, the masking material 175 and 177 and the base contact silicide 174 and 176. FIG. 21 is a cross sectional view taken along the section line 21—21' in FIG. 22 to be discussed next.

FIG. 22 is a top view of the base/isolation region of the bipolar transistor showing the shape of the emitter stripe 150 and the shape of the refractory metal layer etch mask 179. The isolation island 128 is coincident with the rectangular base region 136. The polysilicon emitter stripe 150 is shaped and its mask is aligned so that the stripe portion extends over the center of the isolation island and the base region 136. The refractory metal etch mask is formed in a U shape such that the two legs of the U, 175 and 177, bracket the emitter stripe and cover portions of the base region 136 and a small portion of the metal layer 165 surrounding the base region 136. In FIG. 22, all areas outside the base region 136 are to be understood as covered by the metal layer 165. All areas inside the base region 136 are covered with silicide. Thus all metal in the layer 165 under the mask legs 175 and 177 and under a contact window or post via pad portion 179 of the metal mask is protected by a masking layer of photoresist.

FIGS. 22A and 22B show the relative alignments of the refractory metal etch masks, the isolation islands, and the polysilicon masks in the NMOS DRAM and CMOS static RAM cells respectively. The metal mask outline is shown in solid lines. The isolation islands are shown in dashed lines, and the poly masks are shown in dotted lines. The outline of the masks for forming the contact holes or posts is shown in dash-dot-dash lines.

FIG. 22C shows the mask alignments for a MOS transistor with extended silicide contacts to contact pads for contact windows or post type vias which are external to the perimeter of the isolation island. The coding for the mask outline line types is the same as used in FIGS. 22A and 22B. Note that the alignments are essentially the same as for the bipolar device whose alignments are shown in FIG. 22 except that the refractory metal etch mask is divided into two halves which individually define contact pads for contact windows o post type vias located external to the device isolation island 181 at locations 183 and 185.

FIG. 23A is a cross section of the MOS device made using the process described herein and using the mask alignment and outline shown in FIG. 22C. The section line 23A—23A' in FIG. 22C indicates the location of the cross section of FIG. 23A.

After the silicide has been formed and the foregoing mask step has been performed, the metal not reacting to form silicide which is left exposed by the refractory metal etch mask is removed by chemically selective etching. Since the unreacted metal does not chemically bond with the underlying oxide, it is easily removed. Such etching procedures are well known. This etching step can be either a wet etch with hydrochloric acid or a plasma etch with PT-299 gas or other gas or wet etch compound. FIG. 23 illustrates the result of the refractory metal etch step.

Further information on how to perform the individual steps of the process will be found in the literature and is also found in "Semiconductor and Integrated Circuit Fabrication Techniques" by Peter Gise and Richard Blanchard published by Reston Publishing Company, Reston, Virginia, Library of Congress Number TK7871.85F298 (1979), and "Integrated Circuit Fabrication Technology" by Elliott, McGraw-Hill Publ. Co., Library of Congress Number TK7874.E49 (1982), both of which are hereby incorporated by reference.

The metal layer 165 can be any metal which will react with silicon and polysilicon to form a silicide which is sufficiently conductive so as to not degrade the electrical characteristics beyond a reasonable amount for the application. Some specific etching guides are found at pages 260 and 268 of the Elliott reference. This refractory metal etching step is the same for both the MOS and bipolar processes.

Note that the refractory metal etching step also removes the portions of the metal layer 165 and 165' which were covering the oxide spacers 160/162 and 160'/162' as best shown in FIGS. 23 and 23A. This removes the short circuit between the base and emitter contacts which would otherwise be caused by these portions of the metal layer 165 and removes the gate to source and drain shorts which the metal layer 165' would otherwise cause. The remaining portions 163 and 163' of the metal layer 165/165' serve as an electrical conductor connecting the silicide base contacts 174 and 176 and the source and drain contacts 169 and 171 to areas outside the isolation islands of the transistors for contact to the outside world by contact windows or post type vias.

FIG. 24 shows the mask alignment for the base and emitter portion of the structure in a plan view in preparation for formation of the contact windows to the emitter and base contact pads. The emitter contact window mask is shown at 176, and the base window contact mask is shown at 177. FIG. 24 also clearly shows the outlines of the previously used masks to form the various levels of the structure coded with line types as used in FIG. 22C, and shows the well known encroachment of the field oxide into the device isolation island. Only the area inside the encroachment line 179 is epitaxial silicon. The area outside the encroachment line 179 is field oxide. Because the exact amount of encroachment by the field oxide into the base or isolation region is not known, it is important that the width W of the legs 175 and 177 of the refractory metal mask 181 be such that the edges closest to the emitter contact stripe overlap into the epitaxial silicon region after the encroachment occurs. That is, it is important to align the metal mask 181 such that the inside edges of the legs 175 and 177 are as close as the design rules permit to the outside edges of the emitter stripe to insure that the metal mask 181 overlaps onto the silicide. The same comment is true for the MOS process sequence. If there is no overlap, the metal etching process to remove the remaining portions of the metal layer 175 may etch away parts of the metal layer which were not supposed to be etched, thereby creating a gap and open circuit in the metal conductor 163 which is supposed to connect the silicide base contact to the base contact window or post 177. It is also important to make the width W of the metal mask legs 175 and 177 wide enough to insure coverage of at least part of the metal layer 175 lying outside of but in electrical contact with the silicide base contact. Again, the same is true for the MOS device and process. If there is no overlap onto this refractory metal lying outside the base isolation island, there will be an open circuit in the source and drain contacts. Of course, the closer the inside edges of the metal mask legs 175 and 177 can be aligned with the outside edges of the poly emitter stripe 150, the smaller can be made the base region 136 inside the encroachment line 179.

A completed bipolar transistor is shown in FIG. 25 in plan view. The base contact window or post via is shown at 177, while the the emitter contact window or post via is as shown at 175. The base contact post 177 is coupled to the base contact silicide regions by the layer of refractory metal 163 such that the base contact post can be located outside the perimeter of the base region isolation island 179. The emitter contact post 175 is coupled to the emitter contact poly 150 and silicide layer self aligned with the edges of the emitter contact poly 150 by virtue of the extension of the poly 150 and its silicide cap 168 to the location of the emitter contact post outside the perimeter of the isolation island. The electrical contact between the refractory metal 163 and the base contact silicide 174 and 176 is self aligned because the silicide 174 and 176 is formed from the refractory metal 163. A relatively inexpensive mask 181 for etching the refractory metal 163 can be used and the alignment is not critical except as noted above in the discussion of FIG. 24. All the regions of material in FIG. 25 are coded or cross hatched according to the key at the left of the figure. FIG. 25 is a top orthographic view that corresponds to the cross sectional orthographic view of the finished bipolar device shown in FIG. 26.

Referring to FIG. 25A there is shown a top view of the finished stand alone MOS device showing the locations of the contact windows or posts. The materials are coded as in FIG. 25. FIG. 25A clearly shows the contact structure with extended silicide gate, source and drain contacts to contact pads outside the isolation island perimeter. FIG. 25A is a top orthographic view which corresponds to the sectional orthographic view of FIG. 23A. Refractory metal contacts 163' contact the silicide 171 and 169 on top of the source 145 and the drain 147 respectively. Metal posts 201 and 203 which are the source and drain contacts to the outside world extend down through an intermediate insulating layer over the structure to make contact with the refractory metal 163'. The gate poly 141/167 extends to a contact pad located outside the perimeter 205 (after encroachment) of the isolation island where it makes electrical contact with a gate contact metal post 205.

The manner in which the posts are formed is the same for both the MOS and the bipolar devices. There are several different ways of forming posts which are known. One way is described in a patent application now pending in the United Patent and Trademark Office entitled "Process for Forming Vias on Integrated Circuits", Ser. No. 644,028, filed Aug. 23, 1984 and assigned to the assignee of the present invention. Another way, known as the "lift off" technique, will be described next.

After, the metal etching step to define the refractory metal conductory layer as shown in FIGS. 25 and 25A, a thick photoresist layer (not shown in FIGS. 23A or 26) is formed over the entire wafer in preparation for formation of post type vias. Contact windows having the desired dimensions of the posts, preferably the minimum photolithographically obtainable distance in each dimension, are then formed in a conventional manner in the photoresist at the locations where posts are to be formed. This is done by masking and exposing to radiation all areas of the photoresist except the areas of the posts, e.g. 176 and 177 for the bipolar device and 201, 203 and 205 for the MOS device. The unexposed resist in the post areas is then dissolved away in a known solvent leaving a deep hole where the post is to be formed. Next a layer of post metal is deposited over the entire wafer such that some of it fills the holes in the photoresist to the height of the desired posts. This height should be much less than the thickness of the resist layer. This will cause the step coverage of the metal at the edge of the holes in the resist to be poor or non-existent. Finally, the exposed resist is dissolved in a known solvent. This removes the metal on top of the removed resist but does not remove the metal that has been deposited in the holes. Because the step coverage at the edges of the holes is poor, the metal outside the desired perimeter of the post is completely removed by dissolving the resist on which it rests. This leaves only the posts standing on the die in the desired locations. If posts of different heights are to be formed as in the case of the Static CMOS RAM cell of FIGS. 1-9, the process can be repeated twice, with each iteration used to fabricate posts of a certain height by depositing a layer of metal having a thickness of the desired post height for that iteration.

The choice for the metal of the posts depends upon the nature of the process steps which follow the formation of the posts. It is necessary to form an insulation layer around the posts and to form a planar surface on this insulation layer upon which more metal can be deposited and etched to fabricate the desired circuit pattern in contact with the top of the posts. In the case of the CMOS static RAM shown in FIGS. 1-9, the insulating layers 42 and 43 shown in FIG. 2 must be formed around the single and double height posts. If these layers are to be formed using a high temperature reflow step followed by an etchback to expose the tips of the posts, then a metal must be used for the posts which can withstand the high temperatures of the reflow process. Other methods of forming planarized insulation layers are known however which do not use these high temperatures. If one of these low temperature methods is used, the metal of the posts can be aluminum. In the case of posts underlying the layer of insulating material, the etch back step is continued until the tops of the posts are exposed. A process for forming a planarized layer of insulation over metal structures is described in U.S. patent application "Stress Relieved Intermediate Insulating Layer for Multilayer Metallization", filed June 21, 1985, Ser. No. 747,471 by Bill Lehrer and assigned to the assignee of the present invention. This application describes a method of spinning on a layer of insulating material over a metal pattern and temperature cycling it until it cracks due to the differing thermal expansion coefficients. The cracks are then filled with a CVD oxide layer which mirrors the flatness of the preceding layer. This method could be used to form the insulating layers 42 and 43 in FIG. 2 using an etch back step to expose the tops of the posts embedded in each layer. Both the above cited patent applications are hereby incorporated herein by reference.

If contact windows are to be formed instead of post vias, the process is conventional. After the silicide is formed and all excess refractory metal is removed, an oxide layer is formed by any known process. Known reflow oxide processes will suffice. In these processes the oxide is doped with certain dopants to lower its reflow temperature and the layer of oxide is exposed to an elevated temperature flow the oxide to form a planar upper surface. This eases the process of photolithographically forming the contact windows. When such a process is used, then the metal 165 must be a metal such as titanium, molybdenum, tungsten, or other metal that will not melt at the high temperatures needed to reflow the oxide. Of course other planarization techniques for the insulator layer may be used where such high temperatures need not be used. In such an event, refractory metal for the layer 165 need not be used. The contact windows are then formed by photographically forming a pattern of resist to act as an etch guide and etching contact windows through the insulation layer in the desired locations. Such processes are well known.

As seen best in FIG. 26, silicide layers 174 and 176 cover the upper surface of P— base region 136, except under the emitter contact region 150 and under the spacer oxide regions 160 and 162. Self-alignment of the silicide to the spacer oxide is achieved because silicide is formed on all exposed silicon surfaces only after the spacers 160 and 162 were formed. Only the thickness of spacer oxide 160 and 162 separates silicide layer 174 from emitter contact region 150. The silicide layers 174 and 176 are self aligned with the edges of the refractory metal 163 which leads from the base isolation island to the external base contact. Since silicide is an electrically conductive compound, it may be used as the actual base contact. By using silicide layer 174 as the base contact and by placing the contact post or window to the external world outside the perimeter of the base region isolation island, the distance between the base contact and the emitter contact region can be made quite small. Accordingly, the parasitic junction capacitance and the parasitic extrinsic base resistance of this structure is reduced. The parasitic extrinsic base resistance is reduced because the base current need only travel a very short distance between the base contact and the active area of the transistor under the emitter as best seen in FIG. 21. This distance is given by arrow 178 in FIG. 26. Note that photolithography limitations do not constrain this distance because anisotropic etching, not photolithography, defines the thickness of the spacer oxide. Further, the parasitic base to collector junction capacitance, represented by the small capacitors in FIG. 21, is reduced because the base to collector junction is smaller in area.

Switching speed is thus improved by the placement of the base contact 177 for this vertical transistor outside the perimeter of the base isolation region 136. The resulting smaller junction areas reduces the size of the base to collector and collector to substrate junction capacitances. It also reduces the volume of the base and therefore reduces the amount of minority carrier stored charge that must be dissipated before the transistor can switch. These capacitances and stored charge phenomena and their effects on the high frequency cutoff point of a transistor and its switching speed are well known and are defined and quantized in the literature such as "Electronic Devices and Circuits" by Millman and Halkias, McGraw-Hill (1967), Chapter 13, which is hereby incorporated by reference.

By eliminating from the base area, the area of the base contact window plus all the area consumed by its associated design rule alignment tolerances, the overall transistor cell size and the base isolation island size can be reduced from $4 \times 14$ microns in the prior art to $4 \times 6$ microns with the invention. This makes the inventive cell faster by a factor of 1.5 and smaller by a factor of 2 in cell area consumed compared to the prior art.

The self-aligned, extended source, drain and gate contacts of the MOS devices substantially improve the switching speed of the MOS device since location of the contact windows or posts outside the perimeter of the isolation island allows the gates, sources and drains to be smaller. This reduces the area of the capacitances associated with these structures and thus reduces the parasitic capacitances which slow down switching of the device.

A Schottky diode is also formed by the above described bipolar process in the isolation island 124 of FIG. 23. The Schottky diode includes N— region 124, and the silicide layer 172 forming a contact. Of course in the final device there is an oxide layer and a via formed through this oxide for the aluminum metallization layer to make contact to the silicide contact 172. The diode is formed during the formation of the transistor, and requires no additional processing steps. It can be interconnected as desired using the via and subsequent metallization layer. The collector contact via is formed over the isolation island 126 in FIG. 23 in a similar fashion.

Resistors may also be formed by the above described process. In FIG. 23, one end of the resistor can be contacted by forming a via to the silicide layer 164 contacting doped poly layer 146. This layer is in electrical contact with lesser doped poly layer 140 which can form the resistive element of the resistor. The same is true for the silicide contact 170, the doped poly layer 152 and the layer 140 on the right side of FIG. 23. Layer 140 can extend to another connection that is similar to the one provided by N+ region 152, and the silicide layer 170. The length and resistivity of layer 140 determines the value of the resistor. By permitting resistors and diodes to be constructed on the same wafer as fast bipolar transistors, the present invention provides a broad degree of design freedom to circuit designers.

DIFFERENCES IN THE PROCESS FOR CMOS DEVICE FORMATION

If CMOS is being formed on the same die as bipolar devices using the process of FIGS. 10 through 26 there are at least three process embodiments for forming the P− type epi needed for the N channel device. The first embodiment is to expose all the N channel device isolation islands during the P type base implant in the bipolar process shown in FIG. 11 as shown in FIG. 27. In the bipolar process, the P type implant is used to convert part of the N− epi grown over the buried layer to P− doped epi for a base region. In FIG. 27, this P type implant is masked by a masking layer 134' of photoresist to expose the N channel device island in the CMOS pairs and is used to create the P well 137 for the N channel devices.

Next, as shown in FIG. 28, a thin layer of gate oxide 139 is grown over the exposed P− epi. The bipolar device islands must be masked during the MOS step. The gate oxide step for the N channel devices can coincide with the gate oxide growing step for the P channel devices shown in FIG. 12A. Following the growth of the gate oxide layer, a layer 140' of polysilicon is deposited over the P− epi layer 137 after the mask layer 134' is removed. This step coincides with the analagous step for the P channel devices shown in FIG. 12A. Then a layer of oxide 142' is grown over the poly and etched to expose the poly over the N channel device island. Next, an N type impurity is implanted into the poly and the poly is annealed to repair the implant damage. The N type implant can be done at the same time as the N type implant for the bipolar process is done as shown in FIG. 12. During this N type implant, the P channel device islands must be masked to prevent any N type impurities from being injected into the overlying poly unless N type poly is to be used for the gate contact of the P channel devices. If this is the case, the thresholds will have to be adjusted using other known means. The anneal step may be delayed until later implants are performed however.

Next the gate contact is formed for the N channel devices using a common masking step to define the poly etch patterns for the emitter stripes and the gate contacts for both the N channel and the P channel devices. This step is as symbolized in FIG. 29 which shows a poly etch mask layer 144' of photoresist corresponding to the layer of photoresist 144 used in the bipolar process as shown in FIG. 13. In the bipolar process this mask layer 144 is used to define the emitter stripe 150 and the collector contact 148. In the MOS process, the mask layer 144' is used as an etch guide to define the gate contacts 141. The steps are identical for the N channel and P channel devices up to the source and drain implant. In the CMOS process, there needs to be an extra N type implant shown in FIG. 29 in addition to the P type implant shown in FIG. 13A to form the source and drain regions 149 and 151. From this point forward, the CMOS process is identical to the PMOS/bipolar process shown in FIGS. 10-26.

The foregoing process modifications for making NMOS suffers from the disadvantage that use of the base implant of FIG. 11 to create the P type epi needed for NMOS causes the NMOS device thresholds to be not matched to the thresholds of the PMOS devices. In a second embodiment, a separate P type implant may be used to convert the N type epi to P type in the device islands for the NMOS devices. This implant should be of a concentration so as to bring the doping level in the NMOS channel region to a level of approximately $5 \times 10^{16}$ or whatever level is necessary to match the thresholds of the PMOS devices. The bipolar device islands should be masked during this implant so as to not change the base region doping away from the desired level, i.e., the Gummel number for doping levels needed to provide adequate breakdown voltages without substantially adversely affecting the beta of the transistor. Following this separate P type implant for the NMOS islands, the steps of the rest of the process are as described above.

An alternative embodiment is to use the base implant of FIG. 11 as the implant to create the P type epi for the NMOS devices, but to alter the concentration level of the implant such that the doping level of the P type epi in the NMOS islands is the proper level to achieve matched PMOS and NMOS thresholds. This level will be generally lower than the desired doping level needed in the base region of the bipolar devices to achieve the industry standard Gummel number of $10^{12}$. Thus the energy level of the base implant will have to increased so as to cause a deeper base-collector junction so that the volume of the base area under the emitter region is greater. This allows more dopant atoms to be in the volume, albeit at lower concentration. This raises the Gummel number to an adequate level for sufficient breakdown protection. The deeper base-collector junction degrades high frequency response of the bipolar transistor formed thereby however so this method is not preferred.

The structure of the isolation island for the NMOS devices of either a CMOS or all NMOS structure at an initial stage using the preferred embodiment of the process modifications to the PMOS process sequence described above is shown in FIG. 30. The preferred embodiment for fabricating CMOS and bipolar devices or NMOS and bipolar devices on the same die does not use the P type base implant of FIG. 11 and does not utilize the buried layer 112' under the isolation islands for the N channel devices. Instead the P+ channel stopper 37 customarily used between N+ buried layers of separate bipolar devices (such as the channel stopper 37 in FIG. 3) is extended under the N channel device islands instead of the N+ buried layer. That is, in FIG. 10A, if the isolation island between the field oxide regions 120' and 122' is to contain an N channel device, the N+ buried layer 112' is not formed. Instead, the P+ channel stopper implant 37 (not shown in FIG. 10A but shown at 37 in FIG. 10) to the left and right of the buried layer 112' is extended under the isolation island as shown in FIG. 30. N− epi is then grown over the P+ channel stopper layer 37, but outdiffusion of the P type impurities from the P+ channel stopper layer 37 into the N− epi 128' converts it into a P− epi layer 129'. After conversion of the N− epi to P− epi by the outdiffusion from the P+ channel stopper, a P type implant for the NMOS device islands only is used to raise the doping level at the surface of the P type epi layer 129' to a level of $5 \times 10^{16}$ to form the more heavily doped P− type epi region 137. This P type implant is similar to that shown in FIG. 27 except that the layer of N− epi 128' is P− epi and the N+ buried layer 112' is a P+ channel stopper 37. The resulting doping profile is as shown in FIG. 31 where the doping concentration versus depth from the surface is plotted. Note how the P+ doping of the channel stopper causes decreasing P doping in the epi region as depth approaches the surface, but that the P type implant increases the doping concentration for a shallow region just below the surface where the MOS device current channel between the source and drain will form in the final device. Processing then proceeds as shown in FIGS. 28 and 29 and FIGS. 14-26 to complete the device except that in FIGS. 28 and 29, the N− epi 128' and the N+ buried layer 112' are, respectively P− epi 129' and P+ channel stopper region 37.

DIFFERENCES IN THE PROCESS FOR NMOS ONLY FORMATION

Although a P− substrate 110, is shown with an N+ buried layer 112' and N− epi 128' in FIG. 10, in other embodiments the buried layer could be eliminated such as embodiments where all NMOS transistors are used and CMOS latchup is not a problem. Alpha particle protection can be provided in these cases by starting with P− substrate and extending the P+ channel stopper implant under the areas where the N channel device isolation islands are to be formed as shown in FIG. 30. Then P− epi is grown in the fashion described above for the CMOS process to two microns over the P+ channel stopper depth. The field oxide regions 120' and 122' can then be formed down through the P− epi to form an isolation island. The base implant of FIGS. 11 and 27 is then allowed to impinge on the isolation island for the NMOS device so formed to raise the surface impurity concentration to a higher P concentration level as shown in FIG. 27 and graphed in FIG. 31. Thereafter, the N+ drain and source regions can be implanted into the P− epi after a gate is formed using the process sequence depicted in FIGS. 28 and 29 and as described above. Thereafter, the process is identical to the PMOS process sequence depicted in FIGS. 14-26.

In such an embodiment, alpha particle protection is provided by the P+ channel stopper portion of the substrate which is highly conductive at the three micron depth where most alpha particles come to rest. Further details of the above described device structures and process steps can be found in "MODERN MOS TECHNOLOGY" by DeWitt G. Ong, p.270 et. seq. (McGraw Hill 1984) ISBN 0-07-047709-4, Library of Congress Call Number TK7871.99.M44053 (1984) which is hereby incorporated by reference.

FIG. 26 illustrates a tunnel emitter alternative embodiment of a self-aligned extended silicide base contact bipolar transistor structure. An N+ emitter contact region 150 with a silicide emitter contact 168 and self-aligned oxide spacers 160 and 162 is provided and manufactured as described above. An additional thin oxide layer 102 is also provided separating the emitter poly stripe 150 from the N+ emitter region 154. The oxide layer 102 is formed after thermal oxide layer 132 (see FIG. 11) is removed and before polycrystalline silicon layer 140 (see FIG. 12) is applied. To form oxide layer 102, a thin oxide layer is first thermally grown upon the upper surface of P− base region 136 to a thickness of approximately twenty angstroms. The thin oxide layer is then patterned and etched to leave only layer 102, above which emitter contact region 150 will later be formed. After the polycrystalline silicon emitter 150 is formed, the wafer is heated to an elevated temperature to permit the N+ impurity atoms of the emitter to diffuse across oxide layer 102 and into the P− base region 126 to form N+ emitter region 154. Subsequent processing is performed according to the process described above. Tunnel emitter transistors are known to provide high current gain devices.

AN NMOS DRAM STRUCTURE

Referring to FIG. 32 there is shown a schematic diagram for the dynamic RAM cell of the invention shown in plan view in FIG. 33 (only one of the two cells drawn in FIG. 32 is shown in FIG. 33). FIG. 34 is a section through the cell of FIG. 33 along the section line 34—34' in FIG. 33. The DRAM cell is comprised of a transistor Q1 coupling a bit line to a capacitor C1. The transistor Q1 is a single poly. contactless transistor with extended silicide source and drain contacts fabricated in accordance with the NMOS fabrication process of the invention described above.

The transistor Q1 has a gate G1 comprised of a section of N+ doped polysilicon 300 covered with a layer of self aligned silicide 302. The gate poly and its silicide cap rest on a layer of gate oxide 301 which has its edges self aligned with the edges of the gate poly 300. Oxide spacers or shoulders 304 and 306 protect the gate poly 300 from shorting to any other conducting structure adjacent to the transistor. The drain D1 of Q1 is an N+ doped, implanted region in the P− epi region of the isolation island which is outlined by the dashed line 313 in FIG. 33. The isolation island is defined by the inner edges of the field oxide regions 314 shown in FIG. 34. The drain region D1 is covered by a silicide layer 308 which is self aligned with the edges of the oxide shoulder 306 and the field oxide 314 as shown in FIG. 34 This self alignment results from the process by which this silicide is formed. The silicide layer 308 is electrically connected to a metal bit line 310 by a layer of refractory metal 312 from which the silicide layer 308 was formed and which is in electrical contact with the silicide layer 308. The refractory metal layer 312 was patterned with a metal mask as described above in the process sequence so as to form a refractory metal bit line contact pad over the field oxide 314. This contact pad supports a post type via 310' in the preferred embodiment, but in other embodiments a contact window in an overlying oxide insulation layer 315 could be used.

In the preferred embodiment, the refractory metal layer 312 is preferably comprised of a layered structure with 300 angstroms of titanium on the bottom or substrate side and with 1000 angstroms of tungsten on top of the titanium. The refractory metal layer 312 extends from the top of drain D1 across a field oxide region 314 to the drain D2 of a transistor Q2 of the neighboring cell which shares the same bit line 310. The metal layer 312 serves as a contact pad located outside the perimeter of the isolation island of the transistor Q1 for a contact window through which metal from the bit line 310 can make contact with drains D1 and D2. However, in the preferred embodiment, the contact pad serves as a pad upon which a metal post 310' is fabricated. As noted above in the description of the process sequence, the post 310' may be fabricated of refractory metal or aluminum depending upon the types of process steps and process temperatures which follow the formation of the posts. Aluminum can only be used if later process steps do not involve process temperatures in excess of the melting temperature of the aluminum. If high temperatures are used in later steps such as in reflow of the overlying oxide layer 315 to planarize it, then refractory metal must be used for the post 310' to avoid melting of the post during the later steps. The post 310' makes electrical contact with the refractory metal layer 312 which is itself electrically coupled to the drain regions of the transistors in adjacent cells which share the bit line 310. The post 310' extends up through the intervening insulation layer 315 as a via to the overlying metalization pattern. The intervening insulation layer is then planarized and etched back to expose the top of the post 310' as was done in the static RAM cell of FIGS. 1-9.

The field oxide region 314' has a width of one micron. This field oxide region 314' prevents a parasitic NPN transistor from forming between D1 and D2 with a base width of one micron. The field oxide 314 extends completely through a 2 micron thick P— doped epi layer 52 which is grown on a P+ region of the substrate. The P+ region of the substrate can be an extended channel stopper implant region in a P— substrate if it is desired to manufacture bipolar devices on the same die, or it can be a P+ doped substrate as the starting material. This substrate/epi doping profile provides alpha particle protection since the substrate is highly conductive at about 3 microns down from the surface where alpha particles generally come to rest.

The source S1 of Q1 is an N' doped, implanted region covered with a layer 314 of self aligned silicide. As in the case of the drain region, the silicide layer 314 on top of the source S1 is aligned with and in electrical contact with the edge of a region 316 in the P— epi region 52 which serves as the bottom plate of the cell storage capacitor. On the other side, the silicide layer 314 is self aligned with and bounded by the outside edge of the spacer oxide shoulder 304.

The bottom plate 316 of the capacitor C1 can be either of two alternative structures. The region 316 can be an N+ doped region which is rendered permanently conductive by an implant of N type impurities to create a permanent channel. In this embodiment, the N+ implanted region can be made during the same implant step during which the source and drain regions are implanted. Alternatively, the conductive channel forming the bottom plate of the capacitor can also be formed by applying a permanent, positive bias to the top plate 318 of the capacitor.

The top plate 318 of the capacitor is a region of poly which is doped N' and which is separated from the channel region 316 by a layer of oxide 301. The oxide layer 301 can be formed at the same time as the gate oxide 301. The polysilicon 318 is covered by a self aligned layer of silicide 320, and the vertical surfaces of the poly layer 318 are insulated from adjacent structures by oxide shoulders 322 and 324. The silicide layer 320 on top of the top plate 318 of the capacitor C1 is extended to a contact pad (not shown) where contact with ground or a source of positive potential is made depending upon which embodiment is used for the construction of the bottom plate 316. The silicide 302 on top of the gate poly is extended along with its underlying poly 300 to neighboring isolation islands to serve as the gate contacts for adjacent transistors. The combined silicide and poly structure for the gate electrodes serves as a shared word line for all cells in a row.

FIG. 35 shows a top view of an array of 12 cells of the type shown in FIGS. 33 and 34. A single cell 330 is outlined in phantom to illustrate the maximum dimensions of the cell. For two micron design rules, the DRAM cell size is 10×2 microns or 20 square microns This translates into a one megabit array size of 31,000 square mils or 45,000 square mils when the sense amplifiers, decoders and other peripheral circuitry is added. Such an array size should provide a yield of approximately 30% in a good VLSI fabrication area. It is believed by applicant that this array size, as of the time of filing, is the smallest one megabit DRAM array in the world.

The structures in one of the cells shown in FIG. 35 have been marked with reference numerals corresponding to the same structures in FIGS. 33 and 34. It can be seen from FIG. 35 that the top plate 320 of the capacitor C1 is a single continuous sheet of N+ doped poly 320 covered with a self aligned layer of silicide 318. The boundaries of the isolation island for each transistor under this poly/silicide sheet 320/318 are shown in phantom at 313 for the transistor Q1. Note that the oxide spacers 322 and 324 are shown in FIG. 35 but they are optional. The reason is that there is no need to isolate the top plate 320/318 of the capacitor C1 from the top sheet of the storage capacitor of any other cell since all are a common conductor and are maintained at the same potential.

The data stored in each cell is stored in the form of charge trapped in the depletion or implanted layer 316 serving as the bottom plate of the capacitor. The stored charge creates a potential in the depletion layer 316 which represents a logic one or a logic zero relative to the top plate of the capacitor 318/320. The charge in the depletion layer 316 is stored or drained via the channel of the transistor Q1 when an address signal on the word line 302 causes a channel formation in the enhancement mode NMOS transistor. This channel makes a conductive path to the bit line 310 via the post 310' and the refractory metal path 312. The potential on the capacitor caused by the stored charge will then be coupled to the bit line and any changes in potential or lack thereof on the bit line which result can be sense amplifiers to determine whether the cell stored a logic one or a logic zero. Conversely, the bit line may be charged to the desired logic state to be stored, and that potential will be coupled to bottom plate of the storage capacitor of the addressed cell. The storage capacitor will then be charged to the desired potential and will store that potential when the cell is deaddressed and the conductive channel through the cell transistor becomes non-conductive.

There are certain rules of thumb regarding the ratio of capacitance of the cell storage capacitors to the total parasitic capacitance of the shared bit line and the parasitic capacitance of the contact structure of each cell to the bit line. Each cell has a bit line contact structure parasitic capacitance consisting at least of the junction capacitance $C_{jd}$ of the drain to substrate junction. This parasitic capacitance is drawn in in phantom in FIG. 32. Since the bit line is coupled to every drain in its column in the array, the bit line also has a total parasitic capacitance consisting of the sum of all the drain to substrate parasitic capacitances in parallel plus a component for the metal to substrate capacitance of the bit line metal itself. This total capacitance is shown in phantom as the capacitor $C_c$ in FIG. 32. Generally, the capacitance of a cell storage capacitor, $C_l$, must be at least 10 times the parasitic capacitance $C_{jd}$ of the bit line contact for the cell to work. Further, the total capacitance of the bit line, $C_c$, must not exceed 30 times the capacitance of a single cell storage capacitor, $C_l$.

For the dimensions of the cell given above, the total bit line contact parasitic capacitance is on the order of 0.1 femptofarads for a drain junction area of approximately 0.5 square microns. The capacitance of each storage capacitor, for a 300 angstrom gate oxide layer 301 thickness and an area of 8 square microns per capacitor is approximately 26 femptofarads. Thus, the capacitor for each cell could be made even smaller than is shown in FIG. 33 without adversely affecting performance of the cell.

The NMOS transistors formed by the process of the invention are very small since the source and drain regions do not have to be large enough to contain a contact window for each one. Instead, silicide is formed over each implanted source and drain region, and a refractory metal from which the silicide was formed is used to make contact with the silicide. The refractory metal can then be extended to whatever other structure inside the cell or outside the cell that needs to be in electrical contact with the particular source and drain in question. In effect the refractory metal layer is used as a "free" interconnect layer. This eliminates many contact windows, and results in very small bipolar and MOS transistors. Further these very small transistors can be used to make very small memory cells such as the SRAM and DRAM cells of the invention.

Although the invention has been described in terms of the preferred embodiment given above, it will be apparent to those skilled in the art that numerous modifications can be made without departing from the spirit of the invention defined in the claims below. All such modifications are intended to be included within those claims.

What is claimed is:

1. A field effect transistor comprising:
   a semiconductor substrate having a surface;
   an insulating region extending into the substrate from the surface to surround a first region of the substrate;
   a gate electrode disposed above the substrate to divide the first region of the substrate into a source, a drain, and a channel; and
   an electrically separate source electrode and a drain electrode in electrical contact with the source and drain, respectively, and extending into the insulating region, each of the source and drain electrodes consisting of a layer of metal silicide where in contact with the substrate and a metal where in contact with the insulating region, the metal and the metal silicide being a contiguous layer.

2. A transistor as in claim 1 wherein:
   the gate electrode has sides; and
   a spacer insulating region is disposed on the sides of the gate electrode, the source and drain electrodes extending to the spacer insulating region.

3. A transistor as in claim 2 wherein the gate electrode is disposed on a gate insulating layer which is formed on the substrate.

4. A transistor as in claim 3 wherein the source and drain comprise first conductivity type silicon and the channel comprises opposite conductivity type silicon.

5. A transistor as in claim 1 further comprising:
   an insulating layer disposed over the metal on the insulating region;
   an opening in the insulating layer to expose the metal thereunder; and
   an ohmic connection to the metal through the opening in the insulating layer.

6. A transistor as in claim 5 wherein:
   the gate electrode comprises a region of polycrystalline silicon having sides and a top;
   insulating material is disposed on the sides of the gate electrode but not on the top; and
   the metal silicide on the source and drain extend to contact the insulating material on the sides of the gate electrode.

7. A transistor as in claim 6 further comprising a layer of metal silicide on the gate electrode.

8. A transistor as in claim 7 wherein the metal silicide on the source and drain completely covers the source and drain.

9. A semiconductor structure comprising:
   a semiconductor substrate;
   first and second semiconductor regions in the substrate separated from each other and from the rest of the substrate by an insulating region;
   an electrically conductive source/drain electrode disposed on the first semiconductor region in electrical contact therewith;
   an electrically conductive base electrode disposed on the second semiconductor region in electrical contact therewith;
   a first conductive region disposed on the insulating region in electrical contact with the source/drain electrode;
   a second conductive region, electrically separate from the first conductive region, disposed on the insulating region in electrical contact with the base electrode;
   wherein each of the electrodes consist of metal silicide and each of the conductive regions consist of first metal; and
   a pair of ohmic connections contacting the first metal on the insulating region.

10. A structure as in claim 9 wherein each of the electrodes includes sides and a top, which sides are covered with a spacer of insulating material.

11. A structure as in claim 10 wherein the metal silicide on the first and second semiconductor regions extends to the spacer.

12. A structure as in claim 11 further comprising an additional layer of metal disposed on and containing the first metal.

* * * * *

UNITED STATES PATENT AND TRADEMARK OFFICE
CERTIFICATE OF CORRECTION

PATENT NO. : 5,045,916

DATED : September 3, 1991

INVENTOR(S) : Vora et al.

It is certified that error appears in the above-identified patent and that said Letters Patent is hereby corrected as shown below:

Title Page:
     Line 2 (below the "United States Patent" data block [19]), delete "Vor et al." and insert --Vora et al.--.

Data block [75], line 1, delete "Vor" and insert --Vora--.

Signed and Sealed this

Sixth Day of July, 1993

Attest:

MICHAEL K. KIRK

Attesting Officer      Acting Commissioner of Patents and Trademarks